US012757802B2

(12) United States Patent
Song et al.

(10) Patent No.: US 12,757,802 B2
(45) Date of Patent: Oct. 6, 2026

(54) SEMICONDUCTOR DEVICE AND METHOD OF FORMING THE SAME

(71) Applicant: Taiwan Semiconductor Manufacturing Company, Ltd., Hsinchu (TW)

(72) Inventors: Rui-Wen Song, Hsinchu County (TW); Po-Yuan Teng, Hsinchu City (TW); Hao-Yi Tsai, Hsinchu City (TW); Chia-Hung Liu, Hsinchu City (TW); Shih-Wei Chen, Hsinchu County (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 751 days.

(21) Appl. No.: 18/180,852

(22) Filed: Mar. 9, 2023

(65) Prior Publication Data

US 2024/0304531 A1 Sep. 12, 2024

(51) Int. Cl.

| | |
|---|---|
| ***H10W 46/00*** | (2026.01) |
| ***H10W 70/05*** | (2026.01) |
| ***H10W 74/01*** | (2026.01) |
| ***H10W 74/47*** | (2026.01) |
| ***H10W 90/00*** | (2026.01) |

(52) U.S. Cl.

CPC ......... *H10W 90/701* (2026.01); *H10W 46/00* (2026.01); *H10W 70/093* (2026.01); *H10W 74/01* (2026.01); *H10W 74/47* (2026.01); *H10W 46/301* (2026.01)

(58) Field of Classification Search

CPC ............ H01L 23/5329–53295; H10W 70/695; H10W 70/40

See application file for complete search history.

(56) References Cited

U.S. PATENT DOCUMENTS

| | | | | |
|---|---|---|---|---|
| 9,000,584 | B2 | 4/2015 | Lin et al. | |
| 9,048,222 | B2 | 6/2015 | Hung et al. | |
| 9,048,233 | B2 | 6/2015 | Wu et al. | |
| 9,064,879 | B2 | 6/2015 | Hung et al. | |
| 9,111,949 | B2 | 8/2015 | Yu et al. | |
| 9,263,511 | B2 | 2/2016 | Yu et al. | |
| 9,281,254 | B2 | 3/2016 | Yu et al. | |
| 9,368,460 | B2 | 6/2016 | Yu et al. | |
| 9,372,206 | B2 | 6/2016 | Wu et al. | |
| 9,496,189 | B2 | 11/2016 | Yu et al. | |
| 2019/0051607 | A1* | 2/2019 | Suk | H01L 23/5389 |
| 2022/0165634 | A1* | 5/2022 | Kang | H01L 25/105 |
| 2023/0005819 | A1* | 1/2023 | Olson | H01L 23/481 |
| 2023/0049123 | A1* | 2/2023 | Fan | H10K 59/38 |

* cited by examiner

*Primary Examiner* — Evan G Clinton
(74) *Attorney, Agent, or Firm* — JCIPRNET

(57) ABSTRACT

A semiconductor device includes a die, a redistribution layer (RDL) structure including a first polymer layer, a second polymer layer and a UBM layer. The die is encapsulated by an encapsulant. The RDL structure is disposed over the encapsulant. The second polymer layer is disposed on the first polymer layer, wherein a transmittance of the second polymer layer is smaller than a transmittance of the first polymer layer. The UBM layer is disposed over and electrically connected to the RDL structure, wherein the UBM layer is disposed in the first polymer layer and the second polymer layer.

20 Claims, 23 Drawing Sheets

SEMICONDUCTOR DEVICE AND METHOD OF FORMING THE SAME

BACKGROUND

The semiconductor industry has experienced rapid growth due to continuous improvements in the integration density of various electronic components (e.g., transistors, diodes, resistors, capacitors, etc.). For the most part, this improvement in integration density has come from repeated reductions in minimum feature size, which allows more of the smaller components to be integrated into a given area. These smaller electronic components may require smaller packages that utilize less area than previous packages. Currently, integrated fan-out packages are becoming increasingly popular for their compactness. How to ensure the reliability of the integrated fan-out packages has become a challenge in the field.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
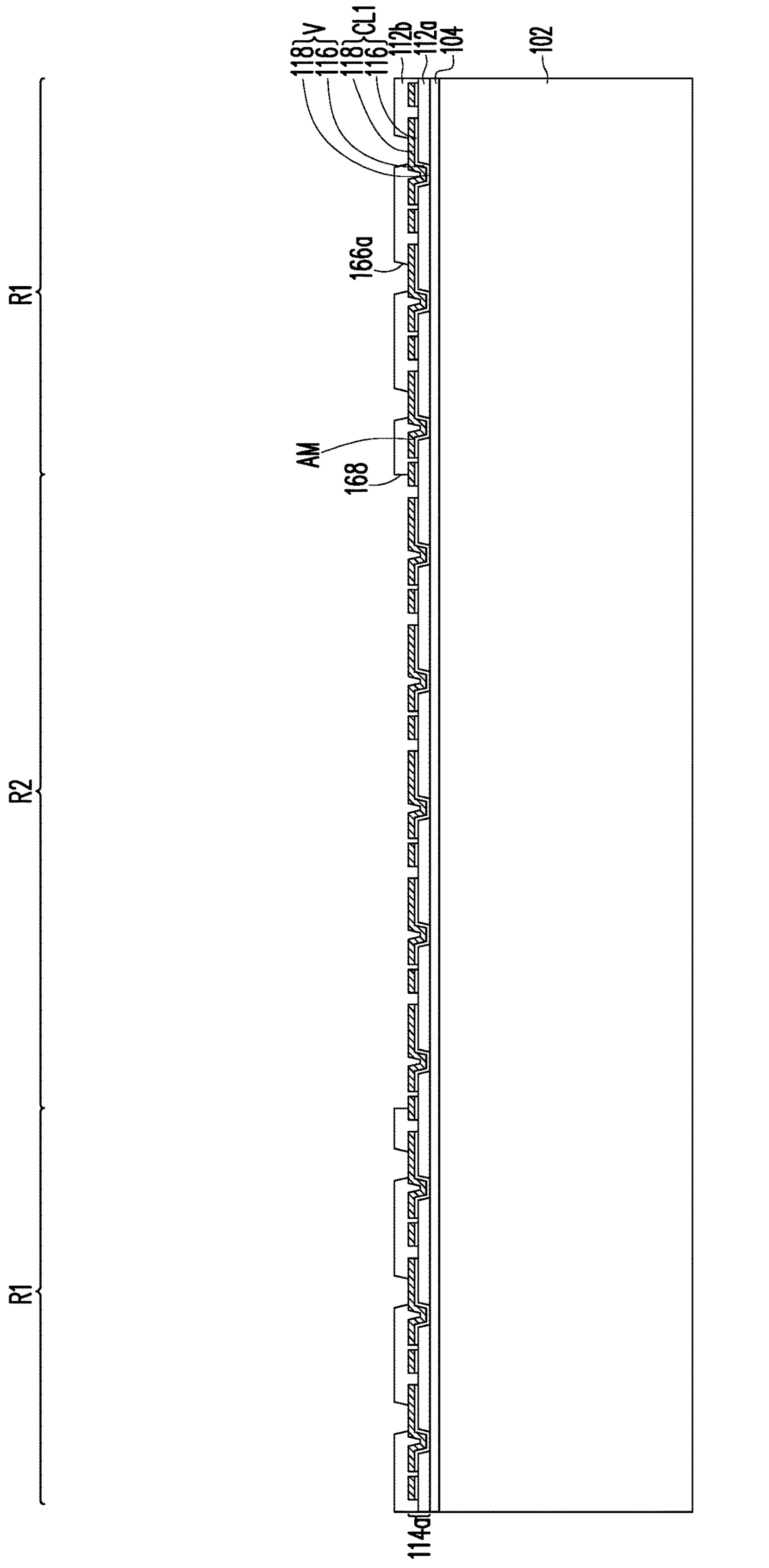
FIG. 1A to FIG. 1J are schematic cross-sectional views of various stages in a method of forming a semiconductor device in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "on," "over," "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Further, when a number or a range of numbers is described with "about," "approximate," and the like, the term is intended to encompass numbers that are within a reasonable range considering variations that inherently arise during manufacturing as understood by one of ordinary skill in the art. For example, the number or range of numbers encompasses a reasonable range including the number described, such as within +/−10% of the number described, based on known manufacturing tolerances associated with manufacturing a feature having a characteristic associated with the number. For example, a material layer having a thickness of "about 5 nm" can encompass a dimension range from 4.25 nm to 5.75 nm where manufacturing tolerances associated with depositing the material layer are known to be +/−15% by one of ordinary skill in the art. Still further, the present disclosure may repeat reference numerals and/or letters in the various examples. This repetition is for the purpose of simplicity and clarity and does not in itself dictate a relationship between the various embodiments and/or configurations discussed.

Figure 1B:
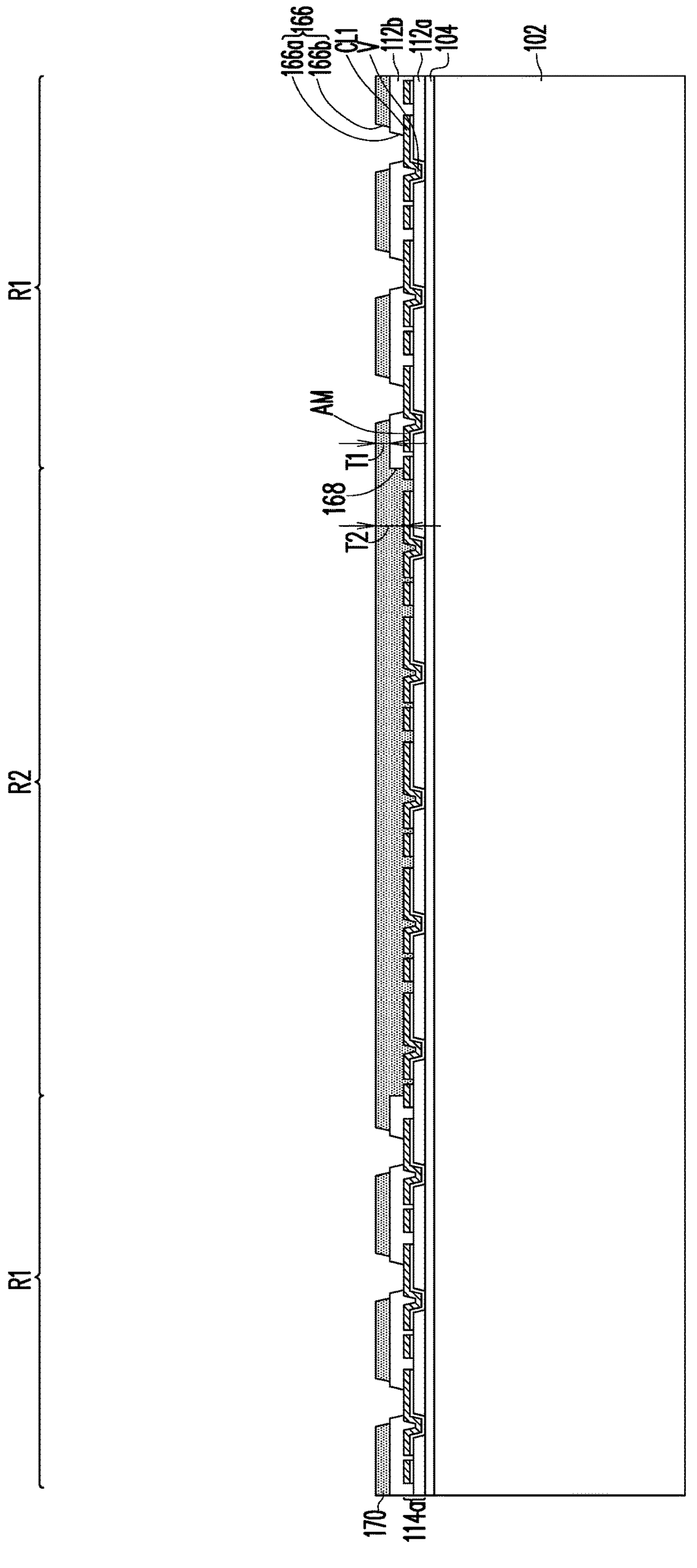
Figure 1C:
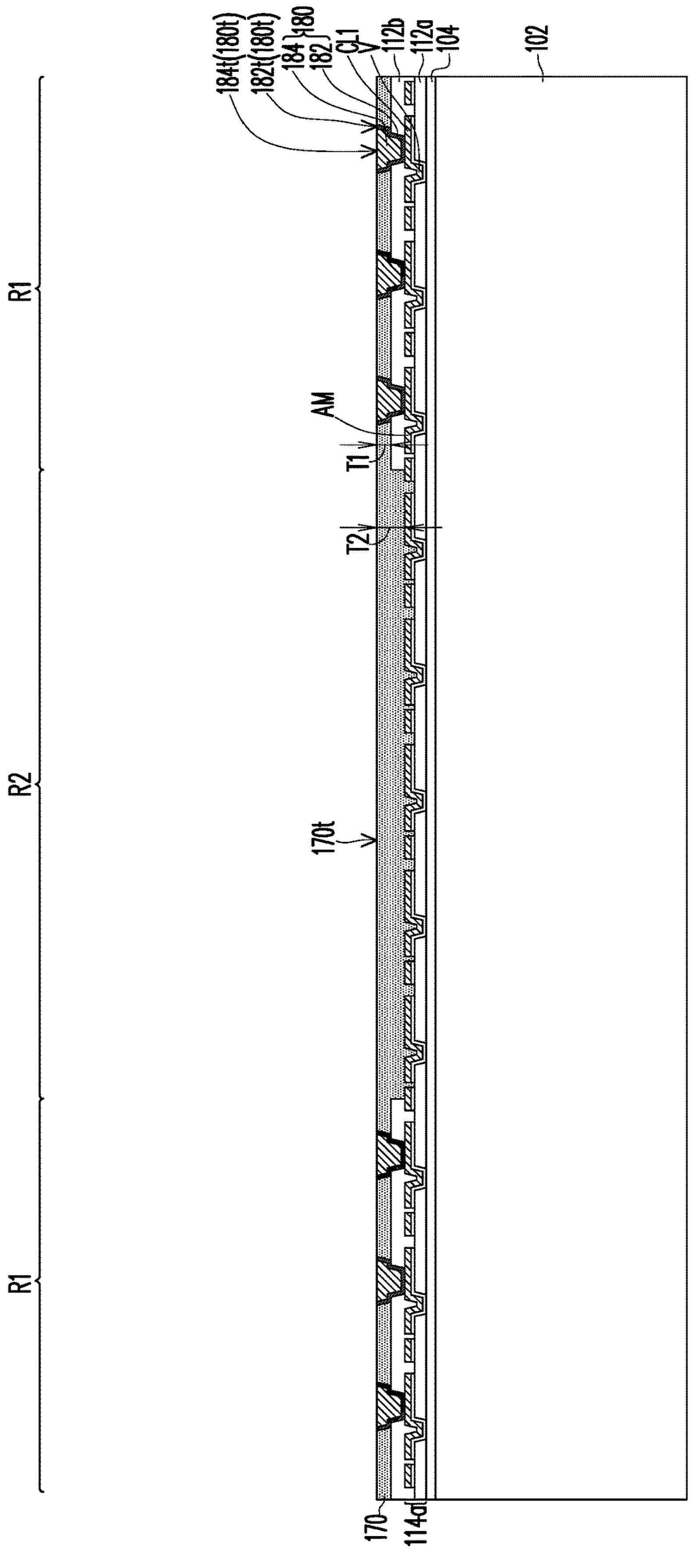
Figure 1D:
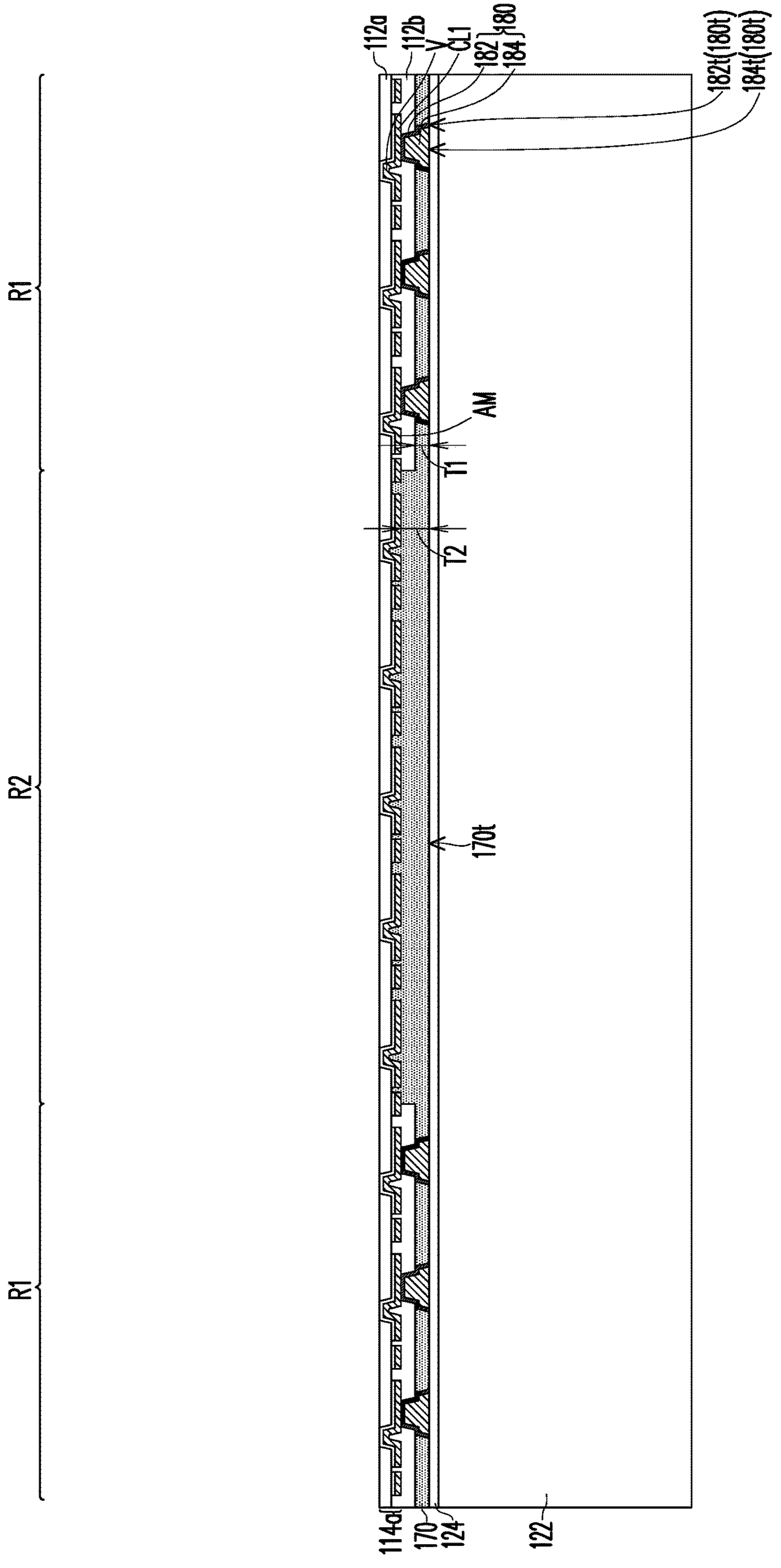
Figure 1E:
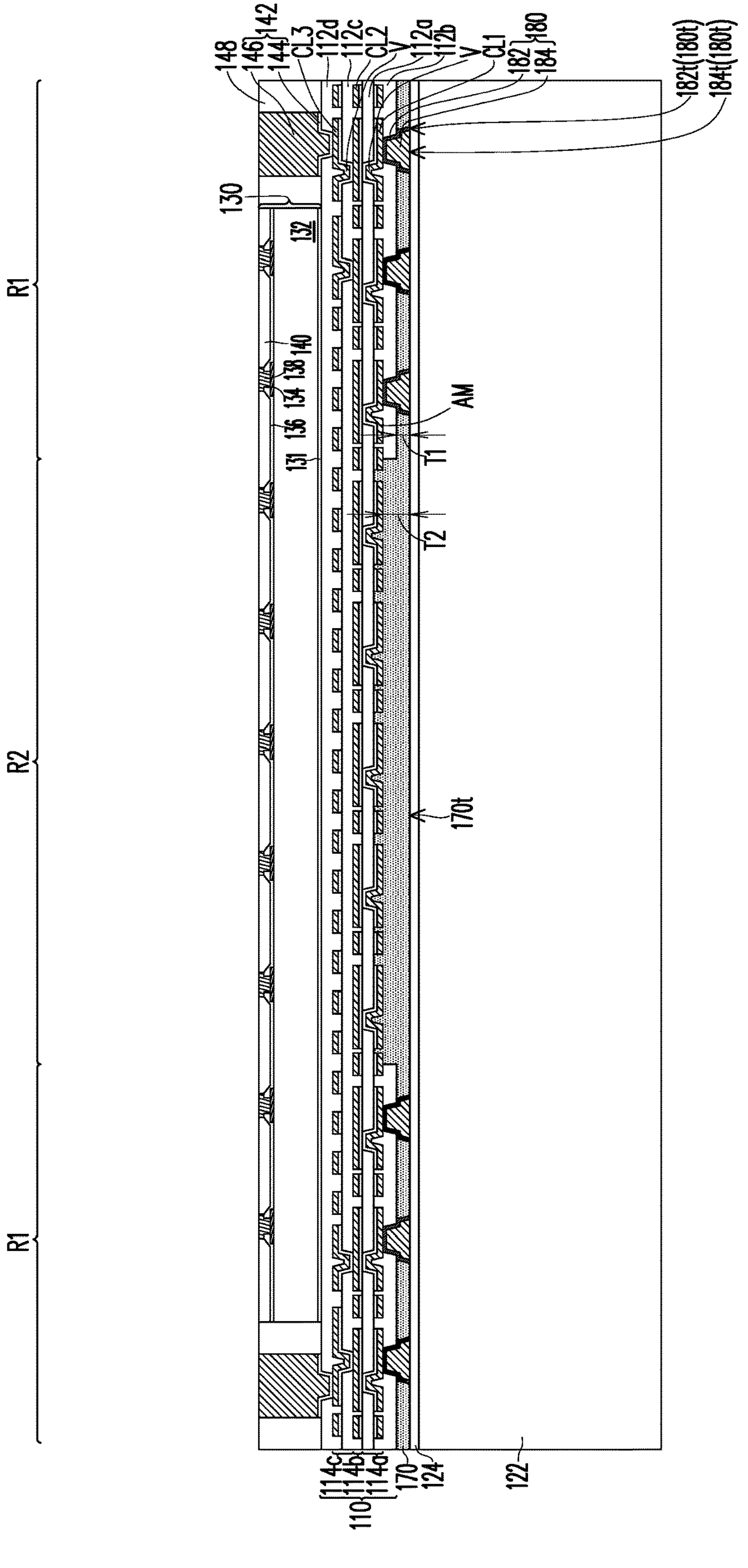
Figure 1F:
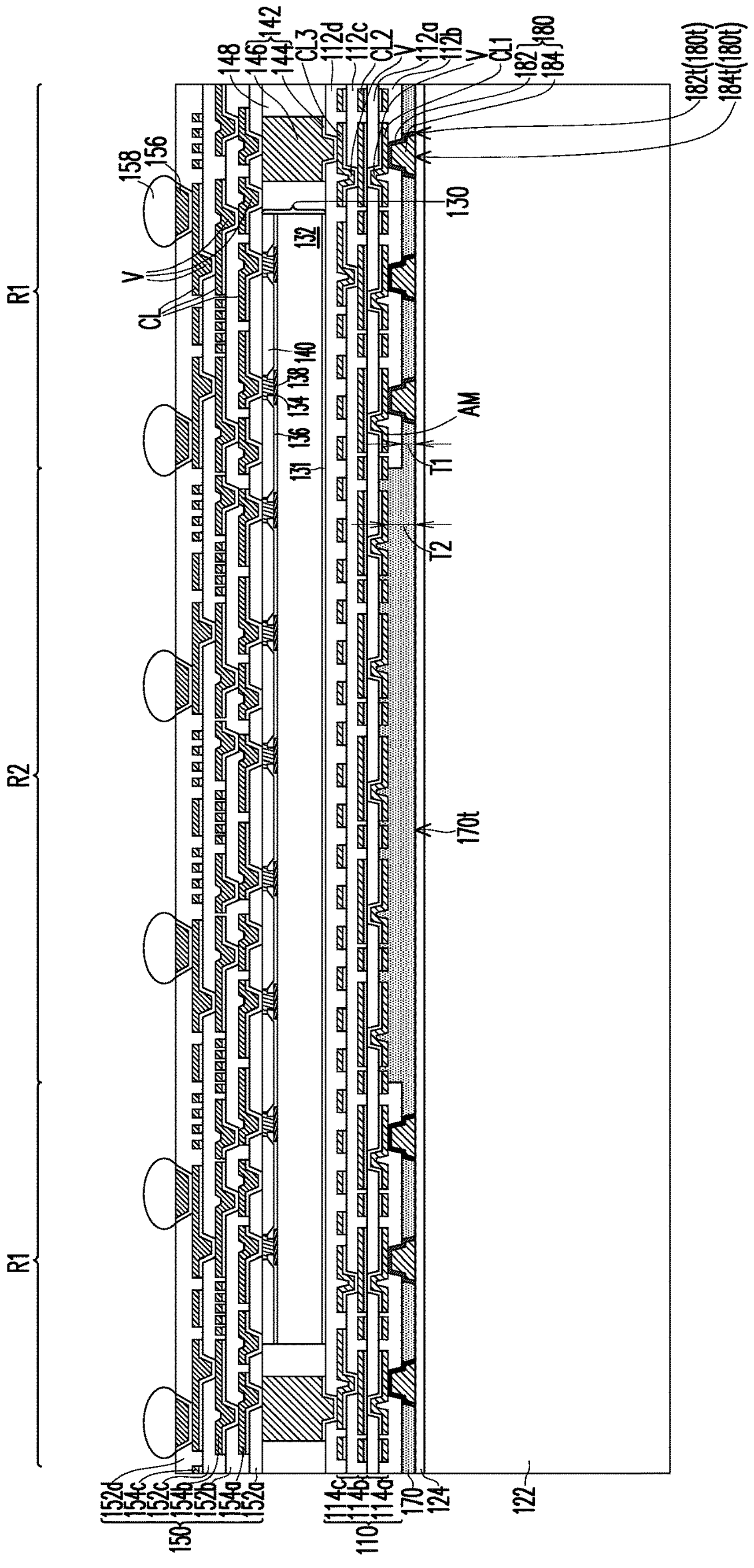
Figure 1G:
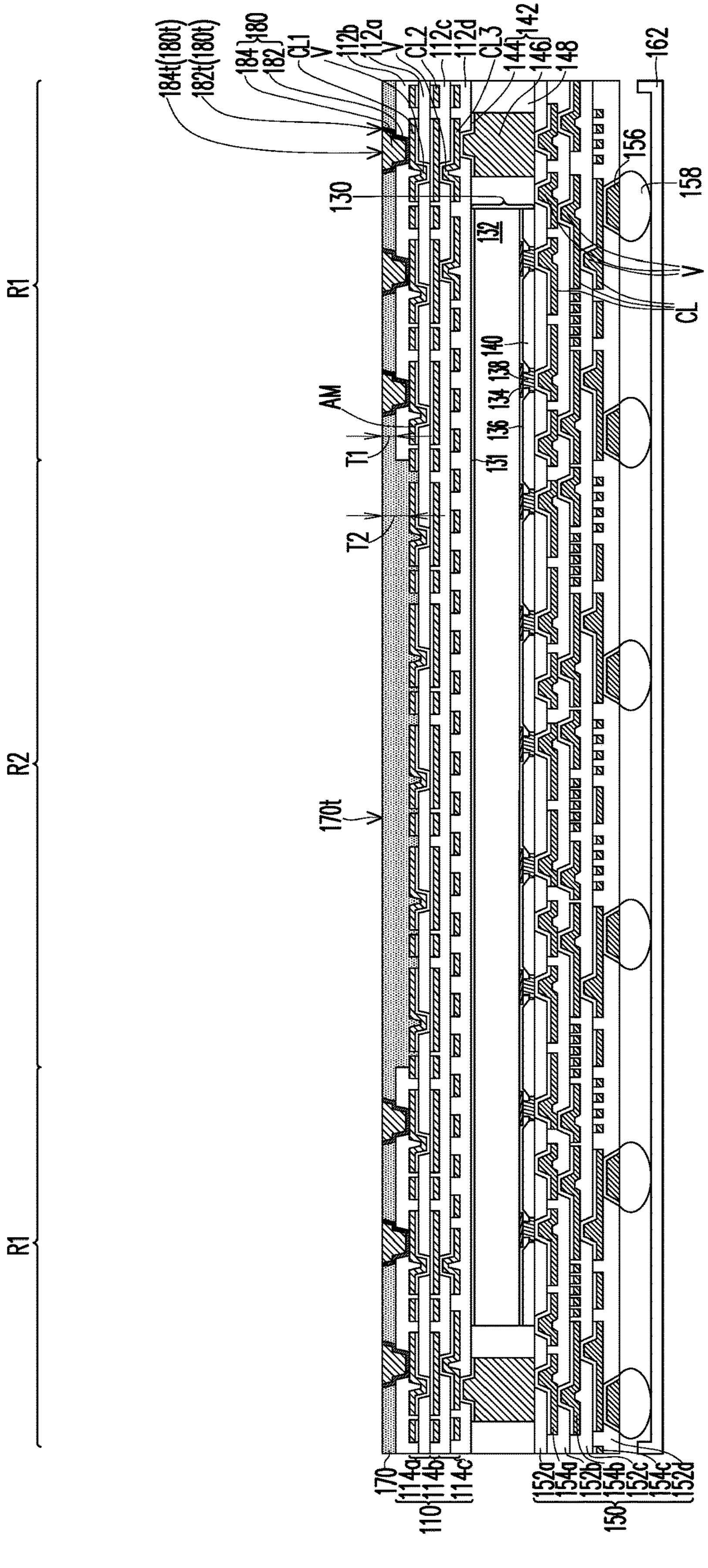
Figure 1H:
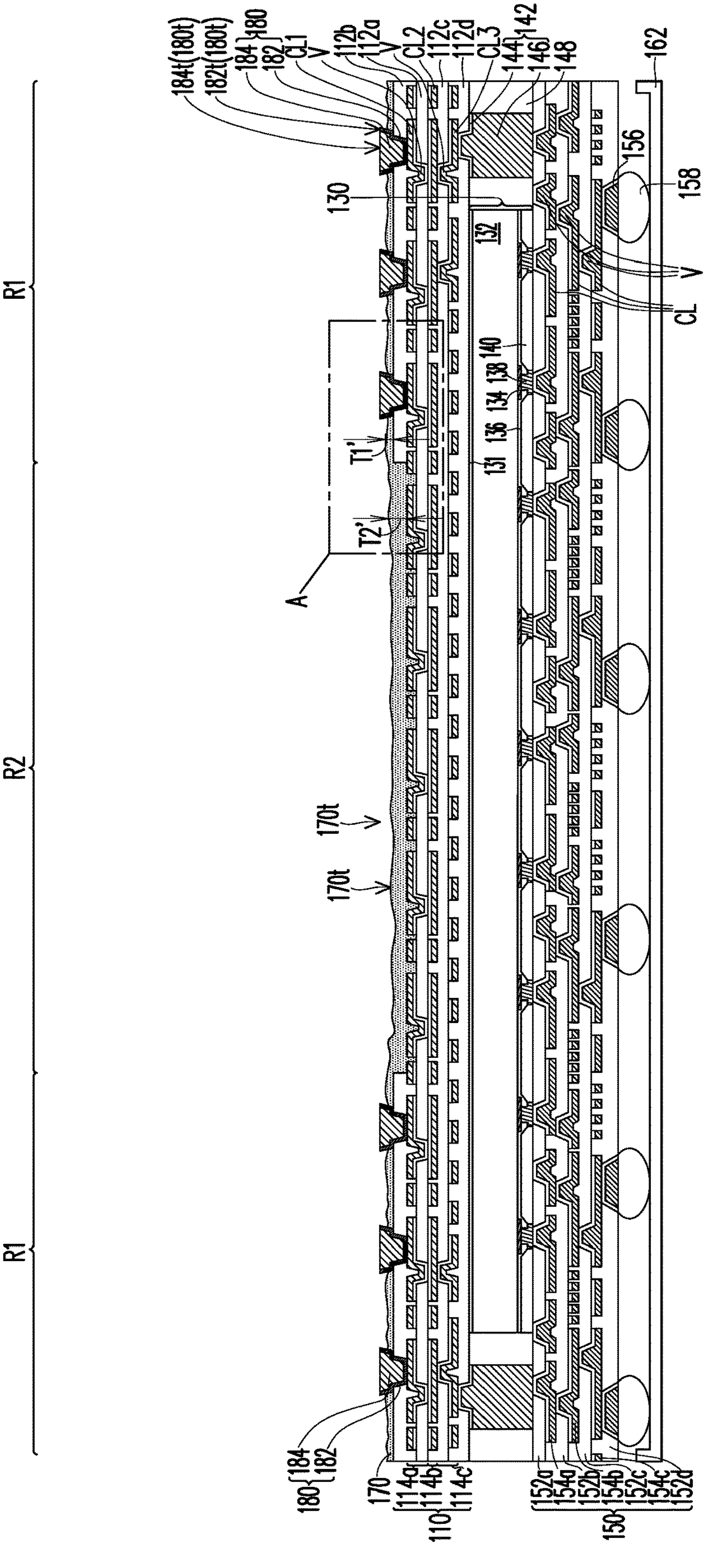
Figure 1I:
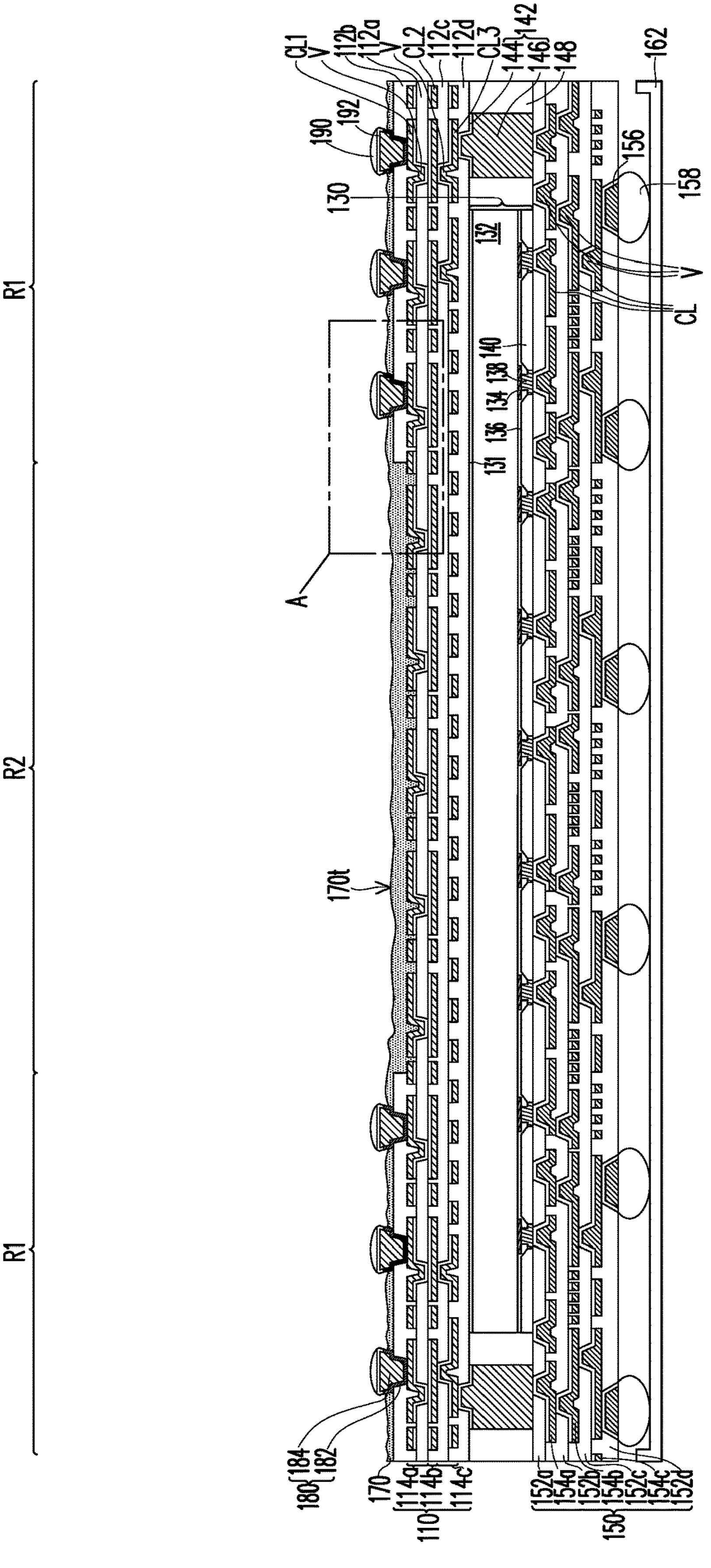
Figure 1J:
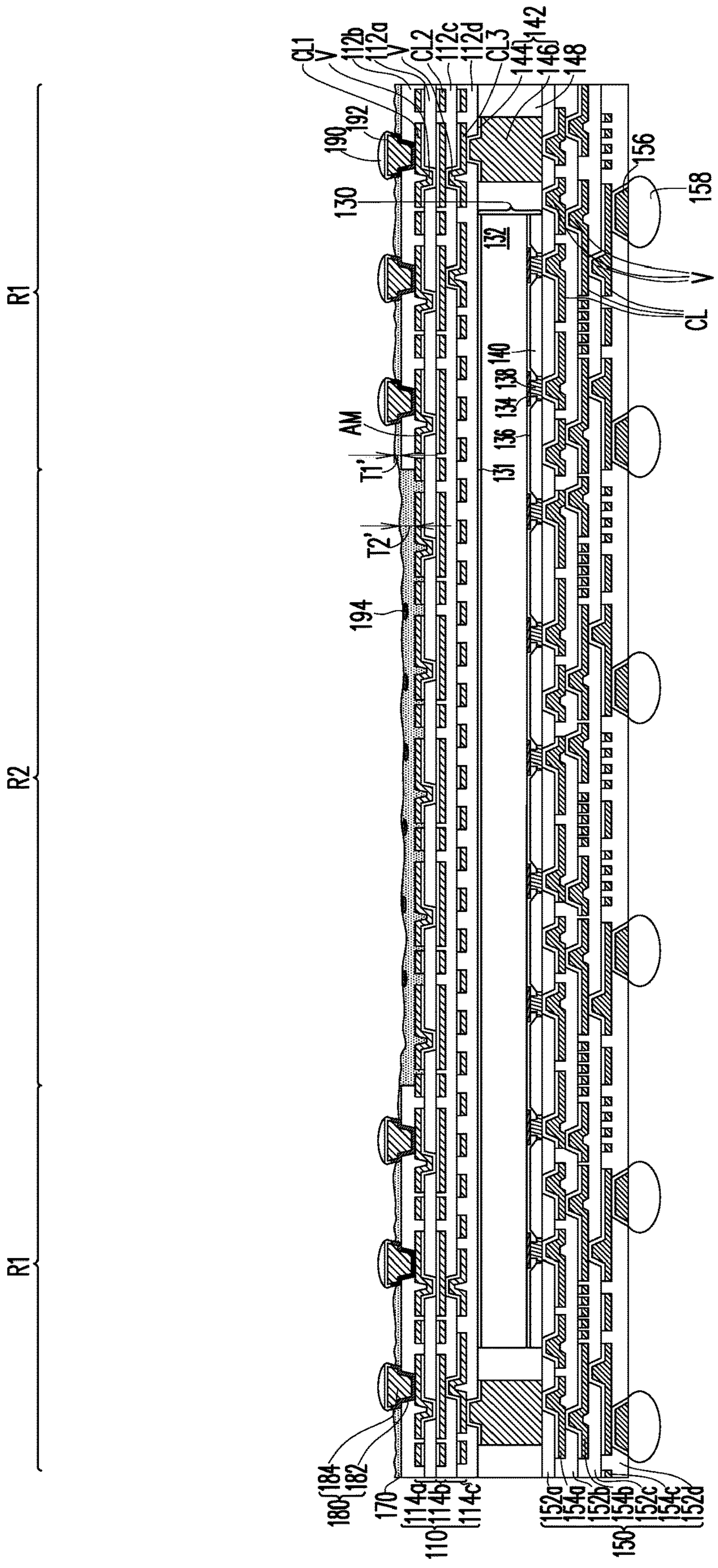
Figure 2A:
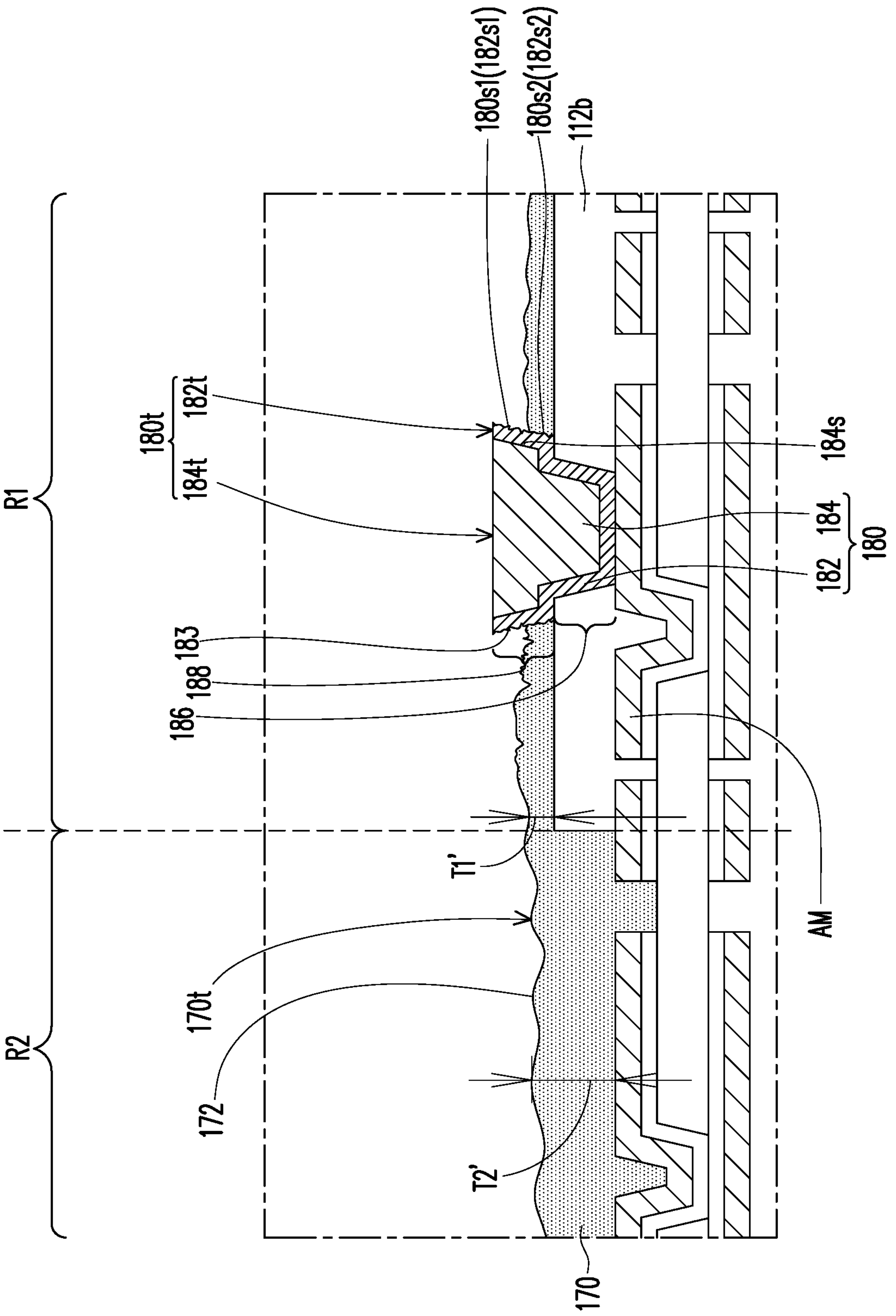
FIG. 2A and FIG. 2B are respectively enlarged view of a region A in FIG. 1H and FIG. 1I.
Figure 2B:
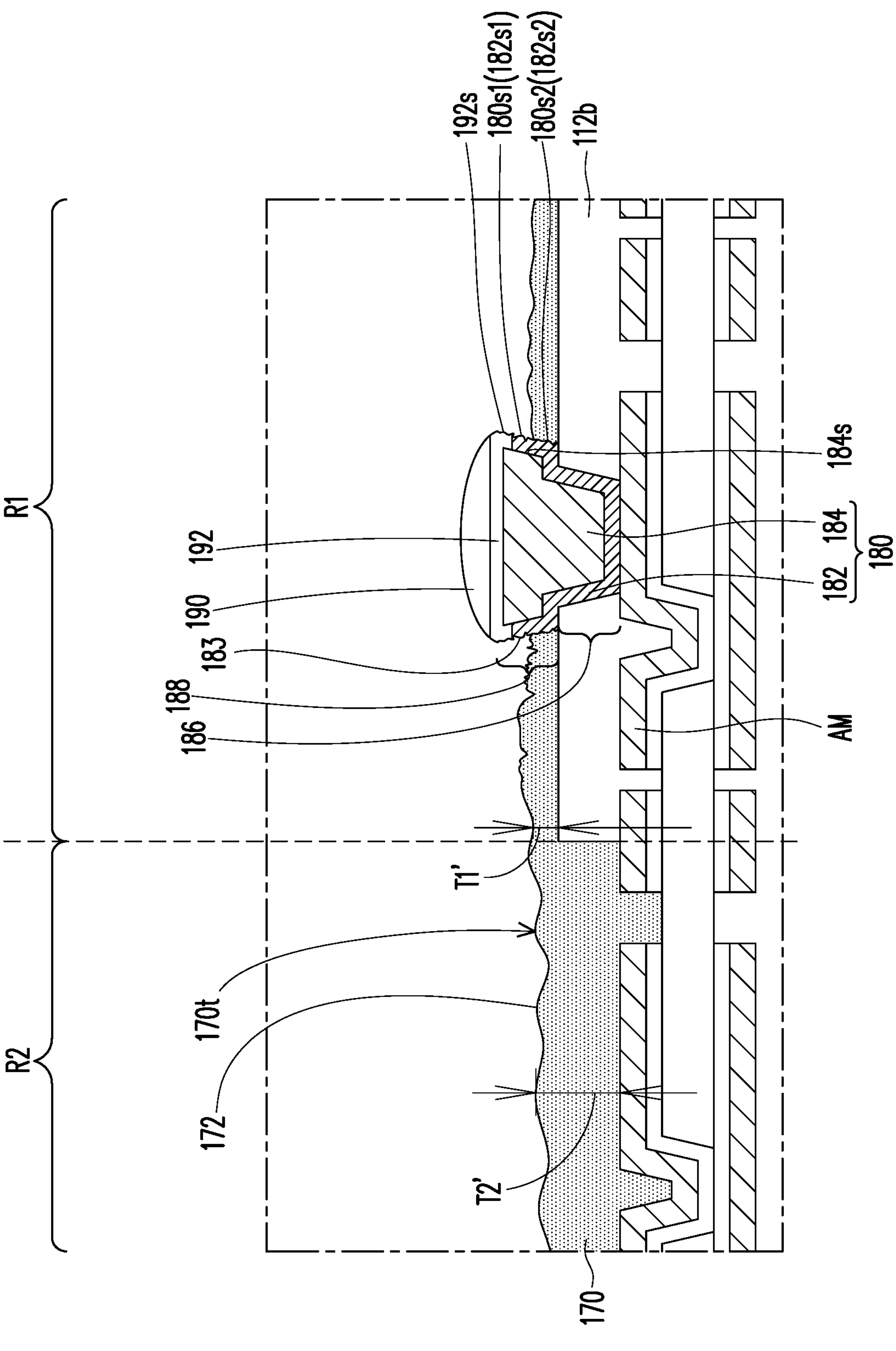
Figure 3:
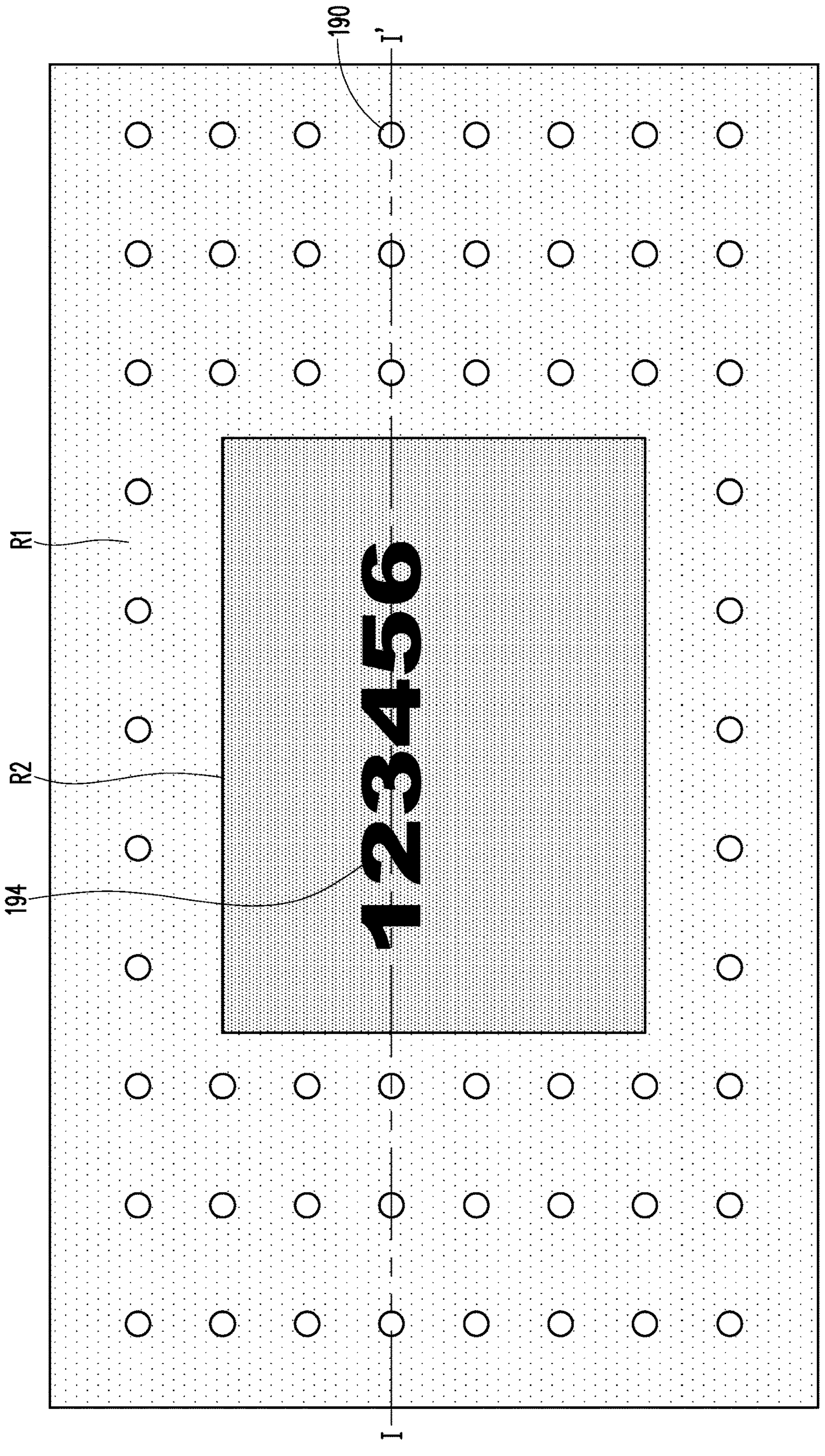
FIG. 3 is a schematic top view of a semiconductor device in accordance with some embodiments of the present disclosure.

FIG. 1A to FIG. 1J are schematic cross-sectional views of various stages in a method of forming a semiconductor device in accordance with some embodiments of the present disclosure. FIG. 2A and FIG. 2B are respectively enlarged view of a region A in FIG. 1H and FIG. 1I. FIG. 3 is a schematic top view of a semiconductor device in accordance with some embodiments of the present disclosure. FIG. 1J is a cross-sectional view along line I-I' of FIG. 3.

Referring to FIG. 1A, a redistribution layer (RDL) **114*a* is formed over a carrier 102. The carrier 102 may be a glass carrier, a ceramic carrier, or the like. A de-bonding layer 104 is formed on the carrier 102 by, for example, a spin coating method. In some embodiments, the de-bonding layer 104 may be formed of an adhesive such as an Ultra-Violet (UV) glue, a Light-to-Heat Conversion (LTHC) glue, or the like, or other types of adhesives. The de-bonding layer 104 is decomposable under the heat of light to thereby release the carrier 102** from the overlying structures that will be formed in subsequent steps.

In some embodiments, the redistribution layer **114*a* is formed as follows. For example, a polymer layer 112*a* is formed on the de-bonding layer 104, and the polymer layer 112*a* is patterned to form a plurality of openings. Then, a conductive material may be formed over the polymer layer 112*a* to fill up the openings, and the conductive material may be patterned, such that a plurality of conductive vias V may be formed in the openings and a plurality of conductive lines CL1 may be formed on the polymer layer 112*a*. Then, a polymer layer 112*b* may be formed over the polymer layer 112*a* to cover the conductive lines CL1. In some embodiments, a plurality of openings 166*a*, 168 are formed in the polymer layer 112*b*, to expose the redistribution layer 114*a*. In some embodiments, the openings 166*a* are formed in a first region R1, and the opening 168 is formed in a second region R2. As shown in FIG. 3, the second region R2 is a region for laser marking process, and the second region R2 may be surrounded by the first region R1**.

The redistribution layer 114*a* may include the conductive lines CL1 and the conductive vias V in or on the polymer layers 112*a*. For example, the conductive vias V are disposed in the polymer layer 112*a*, the conductive lines CL1 are disposed on the polymer layer 112*a*, and the polymer layer 112*b* covers the polymer layer 112*a* and the conductive lines CL1. In some embodiments, the conductive line CL1 and the conductive via V have a recessed or a flat top surface. The conductive via V and the conductive line CL1 may be integrally formed by a dual damascene process. In such embodiments, there is no interface between the conductive via V and the conductive line CL1.

In some embodiments, the conductive lines CL1 and the conductive vias V includes conductive materials. The conductive materials include metal such as copper, aluminum, nickel, titanium, alloys thereof, a combination thereof or the like, and is formed by a physical vapor deposition (PVD) process such as sputtering, a plating process such as electroplating, or a combination thereof. In some embodiments, the conductive lines CL1 and the conductive vias V include a seed layer 116 and a conductive layer 118 formed thereon, respectively. The seed layer 116 may be a metal seed layer such as a copper seed layer. In some embodiments, the seed layer 116 includes a first seed layer such as a titanium layer and a second seed layer such as a copper layer over the first seed layer. The conductive layer 118 may be copper or other suitable metals.

In some embodiments, each of the polymer layers 112*a*, 112*b* includes a photo-sensitive material such as polybenzoxazole (PBO), polyimide (PI), benzocyclobutene (BCB), a combination thereof or the like. In some embodiments, the polymer layers 112*a*, 112*b* have a transmittance substantially equal to or larger than 90%, and thus the polymer layers 112*a*, 112*b* are substantially (e.g., almost) transparent. For example, the polymer layers 112*a*, 112*b* have a transmittance substantially equal to 92%.

In some embodiments, the polymer layer 112*b* has a transmittance substantially equal to or larger than 90%, and a thickness of the polymer layer 112*b* is substantially equal to or larger than 10 um. However, the disclosure is not limited thereto. In an embodiment, the thickness of the polymer layer 112*b* is smaller than 10 um, for example, the thickness of the polymer layer 112*b* is about 7 um.

In some embodiments, as shown in FIG. 1A, an alignment mark AM is formed simultaneously with the redistribution layer 114*a*, for example. The alignment mark AM may be disposed adjacent to the redistribution layer 114*a*. In some embodiments, a portion of the redistribution layer 114*a* constitutes the alignment mark AM. The alignment mark AM may be disposed in the first region R1.

Referring to FIG. 1B, a polymer layer 170 may be formed over the redistribution layer 114*a* in the first and second regions R1, R2. For example, the polymer layer 170 covers the polymer layer 112*b*. In some embodiments, the polymer layer 170 is in direct contact with the polymer layer 112*b*. In some embodiments, the polymer layer 170 includes a photo-sensitive material such as polybenzoxazole (PBO), polyimide (PI), benzocyclobutene (BCB), a combination thereof or the like. The polymer layer 170 may include a base material the same as the polymer layer 112*b*. For example, the polymer layer 170 and the polymer layer 112*b* both include polyimide. In some embodiments, the polymer layer 170 further includes a dark material such as carbon black in the base material, so that the transmittance of the polymer layer 170 is smaller than the polymer layer 112*b*. For example, the transmittance of the polymer layer 170 is substantially equal to or larger than 50%, and the transmittance of the polymer layer 112*b* is substantially equal to or larger than 90%. The polymer layer 170 is opaque while the polymer layer 112*b* is transparent, for example. The polymer layer 170 is formed by a suitable fabrication technique such as coating, deposition, or similar processes. In some embodiments, the polymer layer 112*b* is also referred to as a first polymer layer, and the polymer layer 170 is also referred to as a second polymer layer.

Generally, the transmittance is inversely proportional to the thickness. In some embodiments, by adjusting the thickness of the polymer layer 170, the polymer layer 170 is suitable for both the following alignment process and laser marking process. As shown in FIG. 1B, the polymer layer 170 on the polymer layer 112*b* in a first region R1 has a first thickness T1, and the polymer layer 170 filling up the opening 168 in a second region R2 has a second thickness T2. The second thickness T2 is, for example, substantially equal to a total thickness of the polymer layer 112*b* and the overlying polymer layer 170 in the first region R1. The first thickness T1 of the polymer layer 170 is thin enough to make the underlying alignment mark AM visible, and thus the following lithography process may be performed accurately with the alignment process. The second thickness T2 of the polymer layer 170 is thick enough, and thus the polymer layer 170 in the second region R2 may be used for the following laser marking process even after partial removal. The first thickness T1 of the polymer layer 170 may be not larger than 20 um. For example, the first thickness T1 of the polymer layer 170 is smaller than 17 um. In some embodiments, the second thickness T2 of the polymer layer 170 (e.g., a total thickness of the polymer layer 112*b* and the overlying polymer layer 170) is smaller than 30 um.

As shown in FIG. 1B, after forming the polymer layer 170, an opening 166*b* is formed in the polymer layer 170 by a lithography process, to expose the underlying opening 166*a*. During the lithography process, the alignment mark AM is visible and used for the alignment process. The opening 166*b* has a width larger than the opening 166*a*, and the opening 166*b* and the underlying opening 166*a* are collectively referred to as an opening 166. In some embodiments, the opening 166 exposes the redistribution layer 114*a*.

Referring to FIG. 1C, a UBM layer 180 is formed in the opening 166, to be electrically connected to the redistribution layer 114*a*. In some embodiments, the UBM layer 180 is formed by depositing a seed material on an exposed surface of the opening 166, depositing a conductive material in the opening 166 and then removing the seed material and the conductive material outside the opening 166. In such embodiments, the UBM layer 180 includes a seed layer 182 on sidewalls and a bottom surface of the opening 166, and a conductive layer 184 filling up the opening 166. The seed layer 182 may be formed of copper alloys that include silver, chromium, nickel, tin, gold, or combinations thereof. The material of the conductive layer 184 may include copper or other suitable metals. In some embodiments, removal of the seed material and the conductive material outside the opening 166 may be performed by a planarization process such as a grinding or polishing process. During the removal process, the polymer layer 170 may be partially removed. In some embodiments, after the planarization process is performed, a top surface 180*t* of the UBM layer 180 is substantially coplanar with a top surface 170*t* of the polymer layer 170. For example, top surfaces 182*t*, 184*t* of the seed layer 182 and the conductive layer 184 are substantially coplanar with the top surface 170*t* of the polymer layer 170. In some embodiments, the UBM layer 180 has a substantially flat top surface. In alternative embodiments, the UBM layer 180 has a recessed top surface conformal to a top surface of the conductive line CL1 therebeneath. In some embodiments, the seed layer 182 at the bottom of the UBM layer 180 may be omitted. In such embodiments, the seed layer 182 forms on the sidewall of the conductive layer 184, and the conductive layer 184 is in direct contact with the conductive line CL1 of the redistribution layers 114*a*.

Referring to FIG. 1D, the structure of FIG. 1C may be flipped upside down, and is placed on another carrier 122. In some embodiments, as shown in FIG. 1D, the redistribution layer 114*a* is de-bonded from the carrier 104. For example, a laser beam may be projected on the de-bonding layer 104, so that the de-bonding layer 104 is decomposed, releasing the structure. Then, the structure including the redistribution layer 114*a*, the polymer layer 170 and the UBM layer 180 may be flipped upside down, and the structure is placed on another carrier 122. In some embodiments, a de-bonding layer 124 is formed between the UBM layer 180 and the carrier 122 and between the polymer layer 170 and the carrier 122.

Referring to FIG. 1E, a plurality of redistribution layers 114*b*, 114*c* may be formed over the redistribution layer 114*a*. For example, a conductive material is formed on the polymer layer 112*a*, and the conductive material is patterned to form a plurality of conductive lines CL2. In some embodiments, the conductive lines CL2 are formed to electrically connect to the vias V of the redistribution layer 114*a*. Then, a polymer layer 112*c* may be formed on the polymer layer 112*a* to cover the conductive lines CL2. Then, the redistribution layer 114*c* and a polymer layer 112*d* is formed over the redistribution layer 114*c*, and the formation of the redistribution layer 114*c* and the polymer layer 112*d* may be similar to or the same as that of the redistribution layer 114*a* and the polymer layer 112*b*. The redistribution layer 114*b* may include the conductive lines CL2 in the polymer layers 112*c*, the redistribution layer 114*c* may include conductive lines CL3 on the polymer layers 112*c* and vias V in the polymer layers 112*c*, and the polymer layer 112*d* covers the redistribution layer 114*c*.

In some embodiments, as shown in FIG. 1E, a RDL structure 110 includes a plurality of redistribution layers 114*a*, 114*b*, 114*c* stacked. The number of the redistribution layers 114*a*, 114*b*, 114*c* and the polymer layers 112*a*, 112*b*, 112*c*, 112*d* shown in FIG. 1E is merely for illustration, and the disclosure is not limited thereto. In some embodiments, the RDL structure 110 is referred to as a back-side RDL structure.

In some embodiments, the conductive lines CL2, CL3 and the conductive vias V includes conductive materials. The conductive materials include metal such as copper, aluminum, nickel, titanium, alloys thereof, a combination thereof or the like, and is formed by a physical vapor deposition (PVD) process such as sputtering, a plating process such as electroplating, or a combination thereof. In some embodiments, the conductive lines CL2, CL3 include a seed layer 116 and a conductive layer 118 formed thereon, respectively. The seed layer 116 may be a metal seed layer such as a copper seed layer. In some embodiments, the seed layer 116 includes a first seed layer such as a titanium layer and a second seed layer such as a copper layer over the first seed layer. The conductive layer 118 may be copper or other suitable metals. In some embodiments, the seed layer 116 of the redistribution layer 114*b* faces and is in direct contact with the seed layer 116 of the redistribution layer 114*a*. In some embodiments in which the seed layer 116 of the redistribution layer 114*b* and the seed layer 116 of the redistribution layer 114*a* have the same material, an interface does not exist between the seed layer 116 of the redistribution layer 114*b* and the seed layer 116 of the redistribution layer 114*a*. In some embodiments, a width of the conductive via V of the redistribution layer 114*c* increases along a direction opposite to a direction along which a width of the conductive via V of the redistribution layer 114*a* increases.

In some embodiments, each of the polymer layers 112*a*, 112*b*, 112*c*, 112*d* includes a photo-sensitive material such as polybenzoxazole (PBO), polyimide (PI), benzocyclobutene (BCB), a combination thereof or the like. In some embodiments, the polymer layers 112*a*, 112*b*, 112*c*, 112*d* have a transmittance substantially equal to or larger than 90%, and thus the polymer layers 112*a*, 112*b*, 112*c*, 112*d* are substantially (e.g., almost) transparent. For example, the polymer layers 112*a*, 112*b*, 112*c*, 112*d* have a transmittance substantially equal to 92%.

Then, a die 130 is bonded to the RDL structure 110, and a plurality of through integrated fan-out vias (TIVs) 142 are formed aside the die 130 over the RDL structure 110. A die 130 is mounted on the polymer layer 112*c* by pick and place processes. In some embodiments, the die 130 is attached to the polymer layer 112*c* through an adhesive layer 131 such as a die attach film (DAF), silver paste, or the like. In some embodiments, the die 130 is one of a plurality of dies cut apart from a wafer, for example. The die 130 may be an application-specific integrated circuit (ASIC) chip, an analog chip, a sensor chip, a wireless and radio frequency chip, a voltage regulator chip or a memory (such as DRAM) chip. The number of the die 130 shown in FIG. 1E is merely for illustration, and the disclosure is not limited thereto. In some embodiments, two or more dies 130 may be disposed side by side on the polymer layer 112*c* over the carrier 122, and the two or more dies 130 may be the same types of dies or the different types of dies.

Still referring to FIG. 1E, the die 130 is disposed on the polymer layer 112*c* and laterally between the TIVs 142, that is, the TIVs 142 are laterally aside or around the die 130. In some embodiments, the die 130 includes a substrate 132, a plurality of pads 134, a passivation layer 136, a plurality of connectors 138 and a passivation layer 140. In some embodiments, the substrate 132 is made of silicon or other semiconductor materials. Alternatively or additionally, the substrate 132 includes other elementary semiconductor materials such as germanium, gallium arsenic, or other suitable semiconductor materials. In some embodiments, the substrate 132 may further include other features such as various doped regions, a buried layer, and/or an epitaxy layer. Moreover, in some embodiments, the substrate 132 is made of an alloy semiconductor such as silicon germanium, silicon germanium carbide, gallium arsenic phosphide, or gallium indium phosphide. Furthermore, the substrate 132 may be a semiconductor on insulator such as silicon on insulator (SOI) or silicon on sapphire.

In some embodiments, a plurality of devices are formed in or on the substrate 132. The devices may be active devices, passive devices, or combinations thereof. In some embodiments, the devices are integrated circuit devices. The devices are, for example, transistors, capacitors, resistors, diodes, photodiodes, fuse devices, or the like, or combinations thereof.

In some embodiments, an interconnection structure and a dielectric structure are formed over the devices on the substrate 132. The interconnection structure is formed in the dielectric structure and connected to different devices to form a functional circuit. In some embodiments, the dielectric structure includes an inter-layer dielectric layer (ILD) and one or more inter-metal dielectric layers (IMD). In some embodiments, the interconnection structure includes multiple layers of metal lines and plugs (not shown). The metal lines and plugs include conductive materials, such as metal, metal alloy or a combination thereof. For example, the conductive material may include tungsten (W), copper (Cu), copper alloys, aluminum (Al), aluminum alloys, or combinations thereof. The plugs include contact plugs and via plugs. The contact plugs are located in the ILD to be connected to the metal lines and the devices. The via plugs are located in the IMD to be connected to the metal lines in different layers.

The pads 134 may be or electrically connected to a top conductive feature of the interconnection structure, and further electrically connected to the devices formed on the substrate 132 through the interconnection structure. The material of the pads 134 may include metal or metal alloy, such as aluminum, copper, nickel, or alloys thereof.

The passivation layer 136 is formed over the substrate 132 and covers a portion of the pads 134. Another portion of the pads 134 is exposed by the passivation layer 136 and serves as an external connection of the die 130. The connectors 138 are formed on and electrically connected to the pads 134 not covered by the passivation layer 136. The connector 138 includes solder bumps, gold bumps, copper bumps, copper posts, copper pillars, or the like. The passivation layer 140 is formed over the passivation layer 136 and laterally aside the connectors 138 to cover the sidewalls of the connectors 138. The passivation layers 136 and 140 respectively include an insulating material such as silicon oxide, silicon nitride, polymer, or a combination thereof. The polymer may include polybenzoxazole (PBO), polyimide (PI), benzocyclobutene (BCB), the like, or combinations thereof. The materials of the passivation layer 136 and the passivation layer 140 may be the same or different. In some embodiments, the top surface of the passivation layer 140 and the top surfaces of the connectors 138 are substantially coplanar with each other.

In some embodiments, the TIVs 142 are formed on the redistribution layer **114*b* to electrically connect to the conductive line CL2. The TIV 142 includes a seed layer 144 and a conductive post 146 on the seed layer 144. In some embodiments, the seed layer 144 is a metal seed layer such as a copper seed layer. For example, the seed layer 144 may include titanium, copper, the like, or a combination thereof. The seed layer 144 may be a metal seed layer such as a copper seed layer. In some embodiments, the seed layer 144 includes a first seed layer such as a titanium layer and a second seed layer such as a copper layer over the first seed layer. The conductive post 146 may include copper or other suitable metals. It is noted that, the number of the TIVs 142 shown in FIG. 1**E is merely for illustration, and the disclosure is not limited thereto.

Then, an encapsulant 148 is then formed on the RDL structure 110 to encapsulant sidewalls and top surfaces of the die 130 and the TIVs 142. In some embodiments, the encapsulant 148 includes a molding compound, a molding underfill, a resin such as epoxy, a combination thereof, or the like. In some other embodiments, the encapsulant 148 includes a photo-sensitive material such as polybenzoxazole (PBO), polyimide (PI), benzocyclobutene (BCB), a combination thereof, or the like, which may be easily patterned by exposure and development processes or laser drilling process. In alternative embodiments, the encapsulant 148 includes nitride such as silicon nitride, oxide such as silicon oxide, phosphosilicate glass (PSG), borosilicate glass (BSG), boron-doped phosphosilicate glass (BPSG), a combination thereof, or the like.

In some embodiments, the encapsulant 148 includes a composite material including a base material (such as polymer) and a plurality of fillers distributed in the base material. The filler may be a single element, a compound such as nitride, oxide, or a combination thereof. The fillers may include silicon oxide, aluminum oxide, boron nitride, alumina, silica, or the like, for example. In some embodiments, the fillers may be spherical fillers, but the disclosure is not limited thereto. The cross-section shape of the filler may be circle, oval, or any other shape. In some embodiments, the encapsulant 148 is formed by a suitable fabrication technique such as molding, spin-coating, lamination, deposition, or similar processes.

In some embodiments, a planarization process is then performed to expose the top surfaces of the connectors 138 of the die 130 and top surfaces of the TIVs 142. The planarization process may include a grinding or polishing process such as a CMP process. In some embodiments, after the planarization process is performed, the top surface of the die 130, the top surfaces of the TIVs 142, and the top surface of the encapsulant 148 are substantially coplanar with each other.

Referring to FIG. 1F, a RDL structure 150 is then formed on the die 130, the TIVs 142 and the encapsulant 148. The RDL structure 150 is electrically connected to the die 130 and the TIVs 142. In some embodiments, the RDL structure 150 includes a plurality of polymer layers **152*a*, 152*b*, 152*c*, 152*d* and a plurality of redistribution layers 154*a*, 154*b*, 154*c* stacked alternately. The number of the polymer layers 152*a*, 152*b*, 152*c*, 152*d* or the redistribution layers 154*a*, 154*b*, 154*c* shown in FIG. 1F is merely for illustration, and the disclosure is not limited thereto. The materials and forming method of the polymer layers and redistribution layers of the RDL structure 150 are similar to, and may be the same as or different from those of the RDL structure 110**.

In some embodiments, the redistribution layer **154*a* is formed on the polymer layer 152*a* and is electrically connected to the connectors 138 of the die 130 and the TIVs 142. The redistribution layer 154*b* may be formed on the polymer layer 152*b* and may be electrically connected to the redistribution layer 154*a*. The redistribution layer 154*c* may be formed on the polymer layer 152*c* and may be electrically connected to the redistribution layer 154*b*. The polymer layer 152*d* may cover the redistribution layer 154*c***.

In some embodiments, similar to the redistribution layers **114*a*, 114*b*, the redistribution layers 154*a*, 154*b*, 154*c* include a plurality of conductive line CL and/or conductive vias V, respectively. In some embodiments, the redistribution layers 154*a*, 154*b*, 154*c* respectively includes a plurality of vias V and a plurality of conductive line CL connected to each other. The vias V are embedded in and penetrate through the polymer layers 152*a*, 152*b*, 152*c*, to connect the underlying TIVs 142, the die 130 or the conductive lines CL of the redistribution layers 154*a*, 154*b*, 154*c*, the conductive lines CL are located on the polymer layers 152*a*, 152*b*, 152*c*, and are extending on the top surface of the polymer layers 152*a*, 152*b*, 152*c***, respectively.

Still referring to FIG. 1F, a plurality of under-ball metallurgy (UBM) layers 156 for ball mounting are formed on the redistribution layer **154*c*, and a plurality of connectors 158** are formed over and electrically connected to the UBM layers 156. In some embodiments, the connectors 158 are referred as conductive terminals. In some embodiments, the connectors 158 may be ball grid array (BGA) connectors, solder balls, controlled collapse chip connection (C4) bumps, or a combination thereof. In some embodiments, the material of the connector 158 includes copper, aluminum, lead-free alloys (e.g., gold, tin, silver, aluminum, or copper alloys) or lead alloys (e.g., lead-tin alloys). The connector 158 may be formed by a suitable process such as evaporation, plating, ball dropping, screen printing and reflow process, a ball mounting process or a C4 process. In alternative embodiments (not shown), a passive device is bonded to the UBM layers 156, and an underfill is formed between the passive device and the UBM layers 156.

Referring to FIG. 1G, in some embodiments, the structure of FIG. 1F is de-bonded from the carrier 122 and flipped over and mounted onto a frame 162. The de-bonding layer 124 is removed.

Referring to FIG. 1H and FIG. 2A, a portion of the polymer layer 170 is removed, so as to expose sidewalls 180*s*1 of the UBM layer 180. In some embodiments, the polymer layer 170 is partially removed by a pulse laser drilling process, an etch process or other suitable process. As shown in FIG. 1H, after partially removal, the top surface 170*t* of the polymer layer 170 is lower than the top surface 180*t* of the UBM layer 180. The UBM layer 180 may have a first portion 186 (e.g., a lower portion) and a second portion 188 (e.g., an upper portion) disposed on and physically connected to the first portion 186. In some embodiments, the first portion 186 of the UBM layer 180 is embedded in the polymer layer 112*b*, and the second portion 188 of the UBM layer 180 is partially disposed in the polymer layer 170 and partially protrudes from the top surface 170*t* of the polymer layer 170. In some embodiments, a connecting face between the first portion 186 and the second portion 188 is substantially coplanar with an interface between the polymer layer 112*b* and the polymer layer 170. In some embodiments, the first portion 186 and the second portion 188 of the UBM layer 180 are integrally formed, and thus an interface does not exist between the first portion 186 and the second portion 188. A width of the first portion 186 is, for example, smaller than a width of the second portion 188, and thus the first portion 186 may be also referred to as a conductive via and the second portion 188 may be also referred to as a conductive line. In some embodiments, the width of the conductive via (i.e., first portion 186) of the UBM layer 180 decreases as the conductive via (i.e., first portion 186) becomes closer to the die 130 (or the RDL structure 150). On contrary, the width of a portion of the TIV 142 in the polymer layer 112*c* increases as the portion of the TIV 142 becomes closer to the die 130 (or the RDL structure 150). In other words, the conductive via (i.e., first portion 186) of the UBM layer 180 and the portion of the TIV 142 have different morphology.

As shown in FIG. 2A, in some embodiments, after partial removal of the polymer layer 170, the top surface 170*t* of the polymer layer 170 is roughened and uneven. For example, the polymer layer 170 includes a plurality of protrusions 172 at the top surface 170*t*. The protrusions 172 are portions of the polymer layer 170, and thus the protrusions 172 have the same material as the polymer layer 170. In some embodiments, exposed sidewalls 180*s*1 of the UBM layer 180 are also partially removed, and thus the sidewalls 180*s*1 of the UBM layer 180 are also roughened and uneven. For example, the exposed sidewalls 180*s*1 of the UBM layer 180 protruding from the polymer layer 170 has a roughness larger than a roughness of the sidewalls 180*s*2 of the UBM layer 180 embedded in the polymer layer 170 and the underlying polymer layer 112*b*. The sidewalls 180*s*1 is physically connected to the 180*s*2 of the UBM layer 180, for example. Particularly, the exposed seed layer 182 of the UBM layer 180 is partially removed, and thus the sidewalls 182*s*1 of the exposed seed layer 182 has a roughness larger than a roughness of the sidewalls 182*s*2 of the embedded seed layer 182. For example, the exposed seed layer 182 has a plurality of protrusions 183 thereon. In some embodiments, the sidewalls 184*s* of the conductive layer 184 are entirely covered by the seed layer 182. However, the disclosure is not limited thereto. In alternative embodiments (not shown), the sidewalls 184*s* of the conductive layer 184 are partially exposed by the exposed seed layer 182. In such embodiments, the seed layer 182 is non-continuously formed on the sidewalls 184*s* of the conductive layer 184, and the exposed seed layer 182 may be also referred to as a plurality of separated patterns.

As shown in FIG. 1H and FIG. 2A, after partial removal, the polymer layer 170 on the polymer layer 112*b* in the first region R1 has a first thickness T1' reduced from the first thickness T1, and the polymer layer 170 in the second region R2 has a second thickness T2' reduced from the second thickness T2. As mentioned above, the second thickness T2 of the polymer layer 170 is selected, and thus after partial removal, the second thickness T2' of the polymer layer 170 is still thick enough for the following laser marking process.

Referring to FIG. 1I and FIG. 2B, a solder layer 190 is formed on the UBM layer 180. In some embodiments, the solder layer 190 is plated on the UBM layer 180, and an intermetallic compound (IMC) 192 may be formed between the solder layer 190 and the UBM layer 180. The solder layer 190 may include lead-based and lead-free solders, such as Pb—Sn compositions for lead-based solder; lead-free solders including InSb; tin, silver, and copper (SAC) compositions; and other eutectic materials that have a common melting point and form conductive solder connections in electrical applications. For lead-free solder, SAC solders of varying compositions may be used, such as SAC 105 (Sn 98.5%, Ag 1.0%, Cu 0.5%), SAC 305, and SAC 405, as examples. Lead-free solders may further include SnCu compounds as well, without the use of silver (Ag). Lead-free solders may also include tin and silver, Sn—Ag, without the use of copper. The IMC 192 may be Cu—Sn intermetallic compound, for example. In some embodiments, a reflow process may be performed, giving the solder layer 190 a shape of a partial sphere in some embodiments. In alternative embodiments, the solder layer 190 may have other shapes, such as non-spherical shapes.

The IMC 192 may be formed on the sidewall of the UBM layer 180. In some embodiments, as shown in FIG. 2B, since the UBM layer 180 protrudes from the polymer layer 170, there is no vertical interface between a sidewall 192*s* of the IMC 192 and the polymer layer 170. Accordingly, the delamination due to the vertical interface between the IMC 192 and the polymer layer 170 is prevented.

Referring to FIG. 1J, a laser marking process is performed to form laser marks 194 in the polymer layer 170. Then, the frame 162 is removed. In some embodiments, from a top view, the UBM layers 180 are disposed in the first region R1, and the laser marks 194 in the polymer layer 170 are disposed in the second region R2. In some embodiments, the polymer layer 170 is continuously disposed in the second region R2 and portions of the first region R1 immediately adjacent to the second region R2. The laser marking process is performed using a laser beam, which burns and removes parts of the polymer layer 170, for example, parts of the carbon black materials of the polymer layer 170. In some embodiments, a plurality of recesses are formed at the top surface of the polymer layer 170 in the second region R2. The burned parts of the polymer layer 170 may overlap the redistribution layer 114*a* therebelow. The laser marks 194 include letters, digits, figures, or any other symbols that can be used for identification purpose. For example, FIG. 3 illustrates some exemplary laser marks 194 that include letters and digits. The laser marks 194 may be used to identify the product, the manufacturing sequence, or any other information that is used to track the respective package. Then, the structure is de-bonded from the frame 162, to form a semiconductor device. The formed semiconductor device may be bonded to another semiconductor device such as a semiconductor package or a circuit board, for example.

Figure 4A:
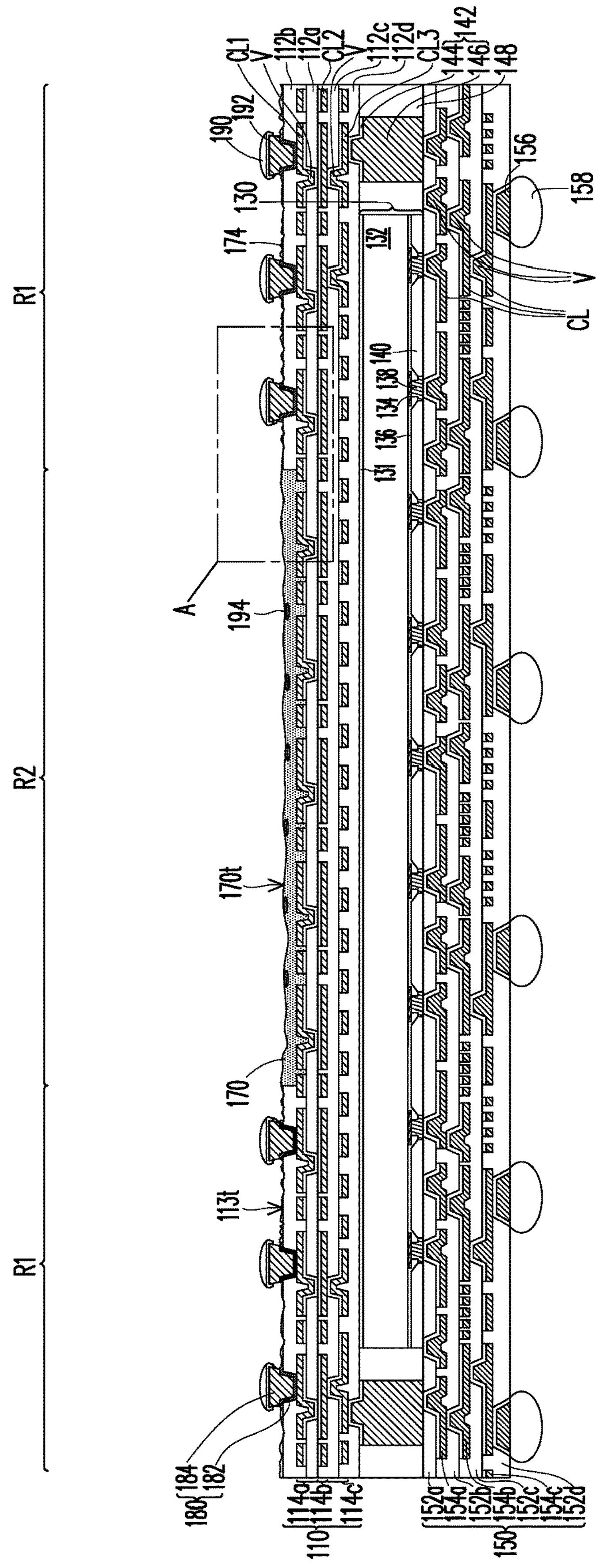
FIG. 4A is a schematic cross-sectional view of a semiconductor device in accordance with some embodiments of the present disclosure.
Figure 4B:
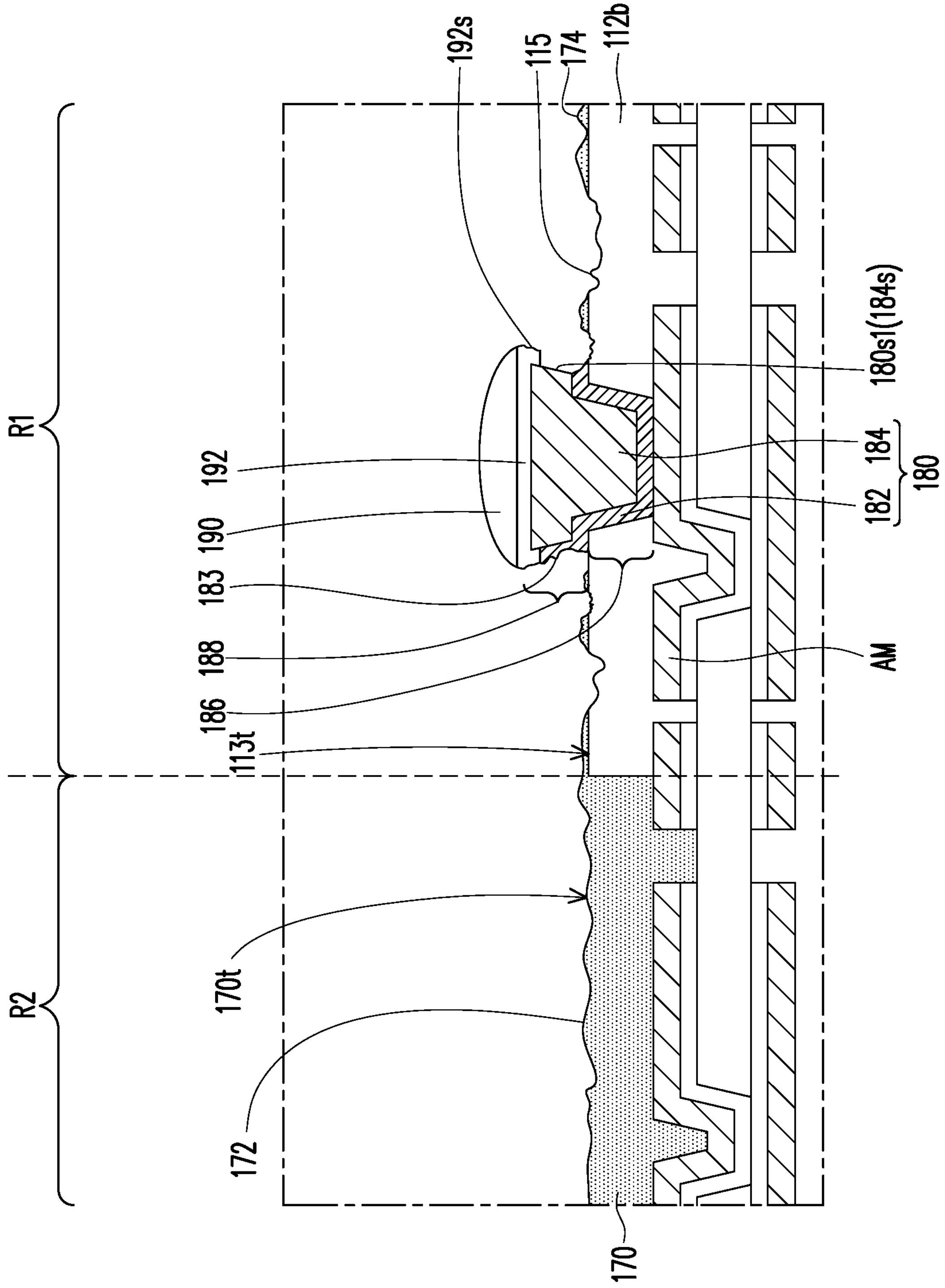
FIG. 4B is an enlarged view of a region A in FIG. 4A.

In some embodiments, the polymer layer 170 in the first region R1 has the first thickness T1'. In other words, the polymer layer 112*b* in the first region R1 is partially covered by the polymer layer 170. However, the disclosure is not limited thereto. In alternative embodiments, as shown in FIG. 4A and FIG. 4B, the polymer layer 170 in the first region R1 may be entirely removed, so that the UBM layer 180 over the polymer layer 112*b* is entirely exposed. For example, the sidewalls 180*s*1 of the UBM layer 180 protruding from the polymer layer 112*b* are entirely exposed, roughened and uneven. In some embodiments, the top surface 170*t* of the polymer layer 170 in the second region R2 is substantially coplanar with the top surface 113*t* of the polymer layer 112*b* in the first region R1. The exposed top surface 113*t* of the polymer layer 112*b* may be partially removed and thus may be roughened and uneven. For example, the polymer layer 112*b* includes a plurality of protrusions 115 at the top surface 113*t*. The protrusions 115 are portions of the polymer layer 112*b*, and thus the protrusions 115 have the same material as the polymer layer 112*b*. In some embodiments, there may be some residues 174 of the polymer layer 170 remained in the first region R1, and the residues 174 of the polymer layer 170 may be also referred to as polymer patterns or polymer protrusions. In alternative embodiments (not shown), there is substantially no residues left in the first region R1.

FIG. 5A to FIG. 5E are schematic cross-sectional views of various stages in a method of forming a semiconductor device in accordance with some embodiments of the present disclosure. FIG. 6A and FIG. 6B are respectively enlarged view of a region A in FIG. 5D and FIG. 5E.

Figure 5A:
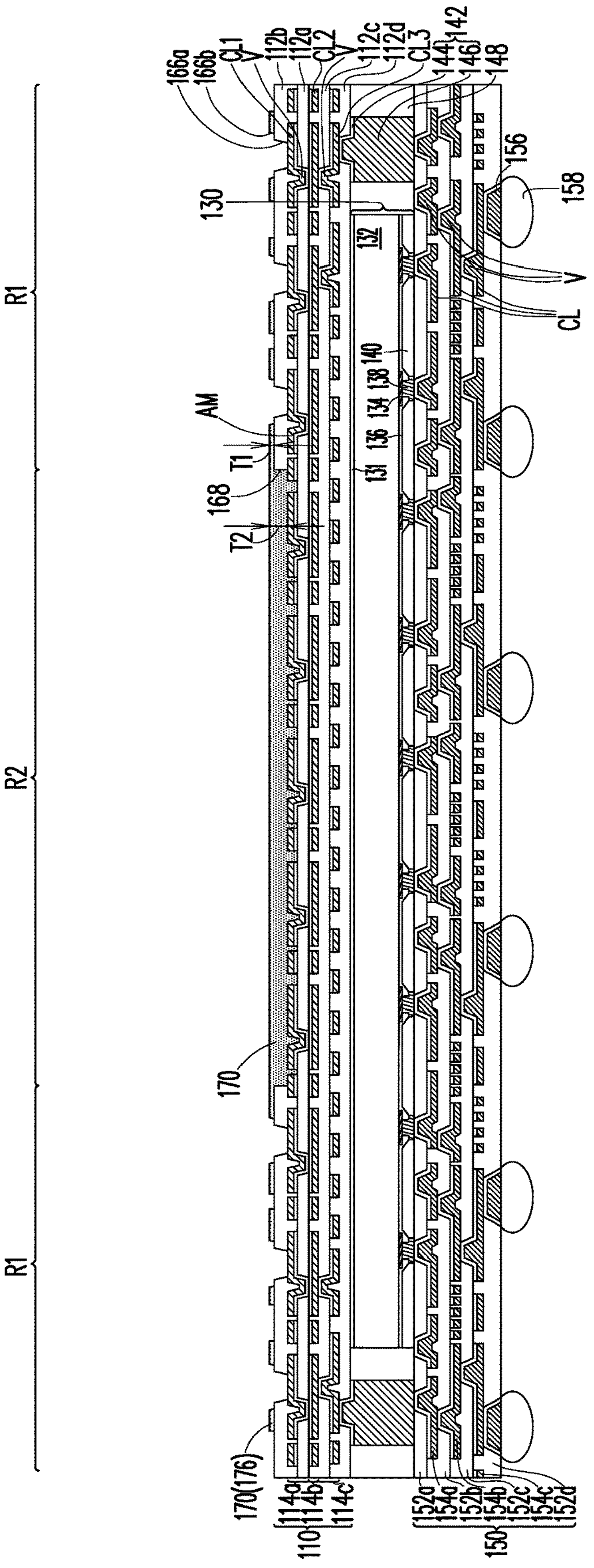
FIG. 5A to FIG. 5E are schematic cross-sectional views of various stages in a method of forming a semiconductor device in accordance with some embodiments of the present disclosure.
Figure 6A:
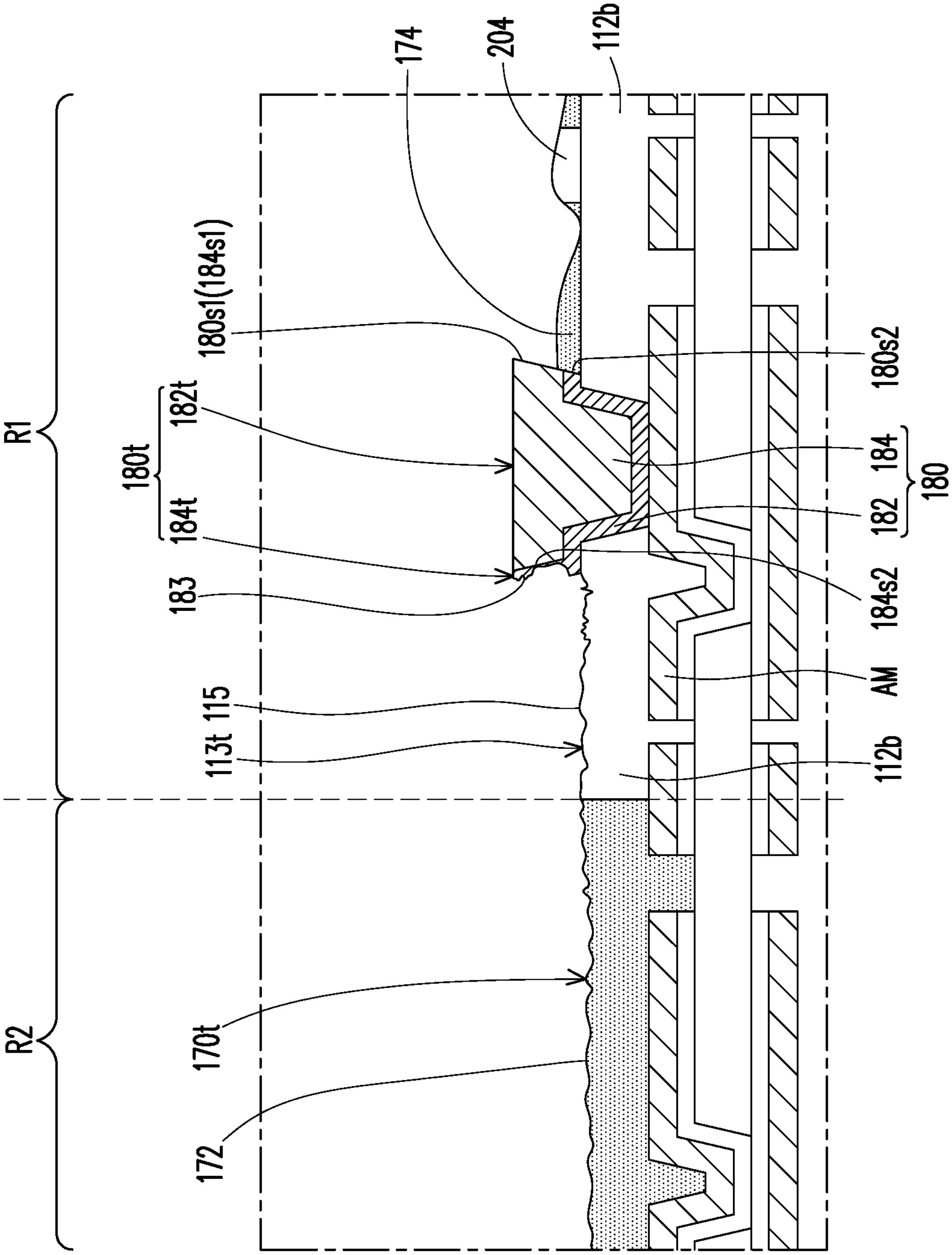
FIG. 6A and FIG. 6B are respectively enlarged view of a region A in FIG. 5D and FIG. 5E.
Figure 6B:
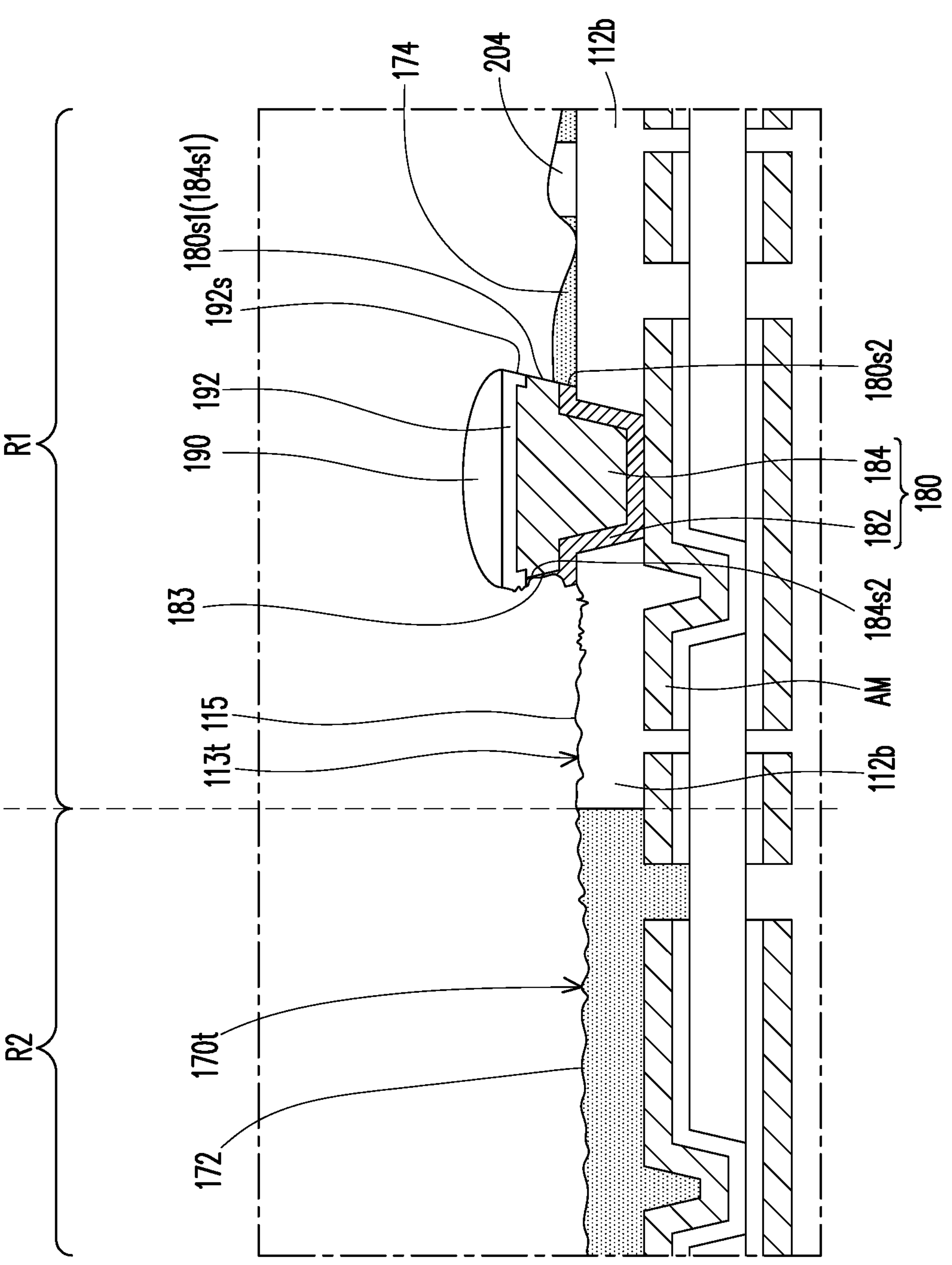

Referring to FIG. 5A, a structure having the outermost polymer layer 112*b* and similar to the structure of FIG. 1E is provided. Then, a polymer layer 170 is formed on the polymer layer 112*b* having the openings 166*a*, 168 therein. In some embodiments, the polymer layer 170 has openings 168*b* to expose the openings 166*a* and fills up the openings 168. The material of the polymer layer 170 may be similar to that described before, and the description is not repeated herein. In some embodiments, the polymer layer 170 on the polymer layer 112*b* in the first region R1 has a first thickness T1, and the polymer layer 170 filling up the opening 168 in the second region R2 has a second thickness T2. The first thickness T1 of the polymer layer 170 may be much thinner than that in FIG. 1F, and thus the alignment mark AM is easier and clearer to see. The thickness T2 is, for example, substantially equal to a total thickness of the polymer layer 112*b* and the overlying polymer layer 170 in the first region R1. In some embodiments, the polymer layer 170 includes a plurality of island-shaped patterns 176 in the first region R1. The island-shaped patterns 176 are disposed on the polymer layer 112*b* and separated from each other, for example.

As shown in FIG. 5A, then, an opening 166*b* is formed in the polymer layer 170 by a lithography process, to expose the underlying opening 166*a*. In some embodiments, during the lithography process, due to a small first thickness T1 of the polymer layer 170 overlying the alignment mark AM, the alignment mark AM is clearer to see and the alignment process is easily performed.

Figure 5B:
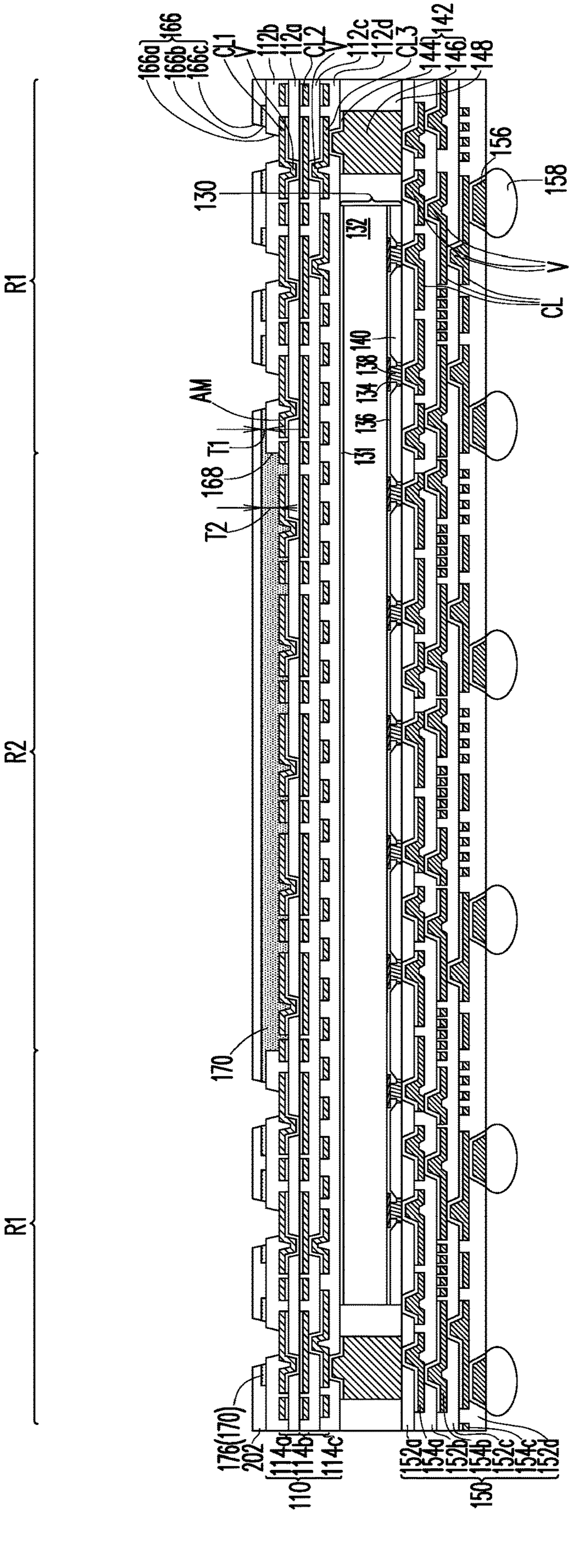

Referring to FIG. 5B, a polymer layer 202 is formed over the polymer layer 112*b* to cover the polymer layer 170, and an opening 166*c* is formed in the polymer layer 202 to expose the opening 166*b*. Sidewalls of the opening 166*c* are substantially flush with sidewalls of the opening 166*b*, for example. The openings 166*a*, 166*b* and 166*c* may be collectively referred to as an opening 166. In some embodiments, the polymer layer 170 is interposed between the polymer layer 112*b* and the polymer layer 202. For example, the island-shaped patterns 176 in the first region R1 are respectively interposed between the polymer layer 112*b* and the polymer layer 202.

In some embodiments, the polymer layer 202 has a transmittance much larger than the polymer layer 170. Thus, the alignment mark AM under the polymer layer 202 and the polymer layer 170 may be clearer to see. Accordingly, during the lithography process for the opening 166*c*, the alignment process may be easily performed. The transmittance of the polymer layer 202 may be substantially the same as or similar to the transmittance of the polymer layer 112*b*. For example, the transmittance of the polymer layer 202 is substantially equal to or larger than 90%, and thus the polymer layer 202 is substantially (e.g., almost) transparent. The polymer layer 202 may have a transmittance substantially equal to 92%. The polymer layer 202 may include a photo-sensitive material such as polybenzoxazole (PBO), polyimide (PI), benzocyclobutene (BCB), a combination thereof or the like. The polymer layer 202 may have the same material as the polymer layer 112*b*.

Figure 5C:
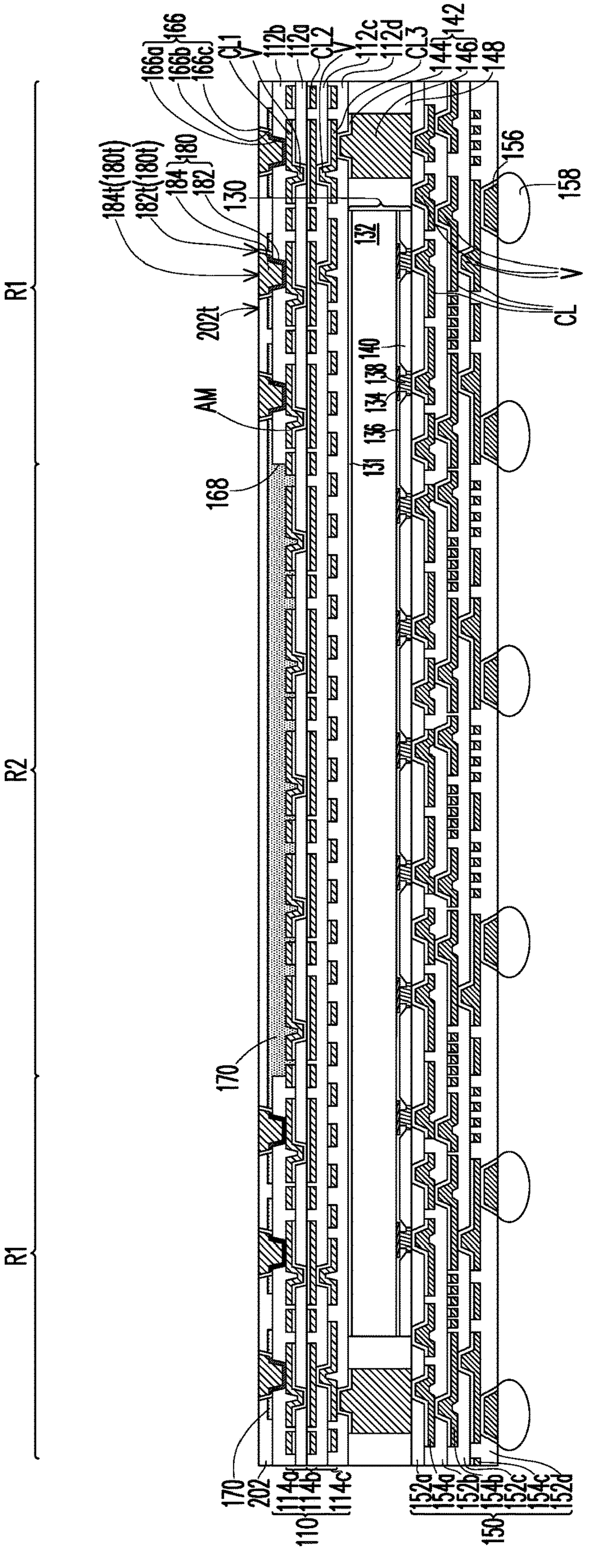

Referring to FIG. 5C, a UBM layer 180 is formed in the opening 166, to electrically connected to the RDL structure 110. The formation and configuration of the UBM layer 180 are similar to those of the UBM layer 180 described before, and the description is not repeated herein. In some embodiments, a top surface 180*t* of the UBM layer 180 is substantially coplanar with a top surface 202*t* of the polymer layer 202. For example, top surfaces 182*t*, 184*t* of the seed layer 182 and the conductive layer 184 are substantially coplanar with the top surface 202*t* of the polymer layer 202.

Figure 5D:
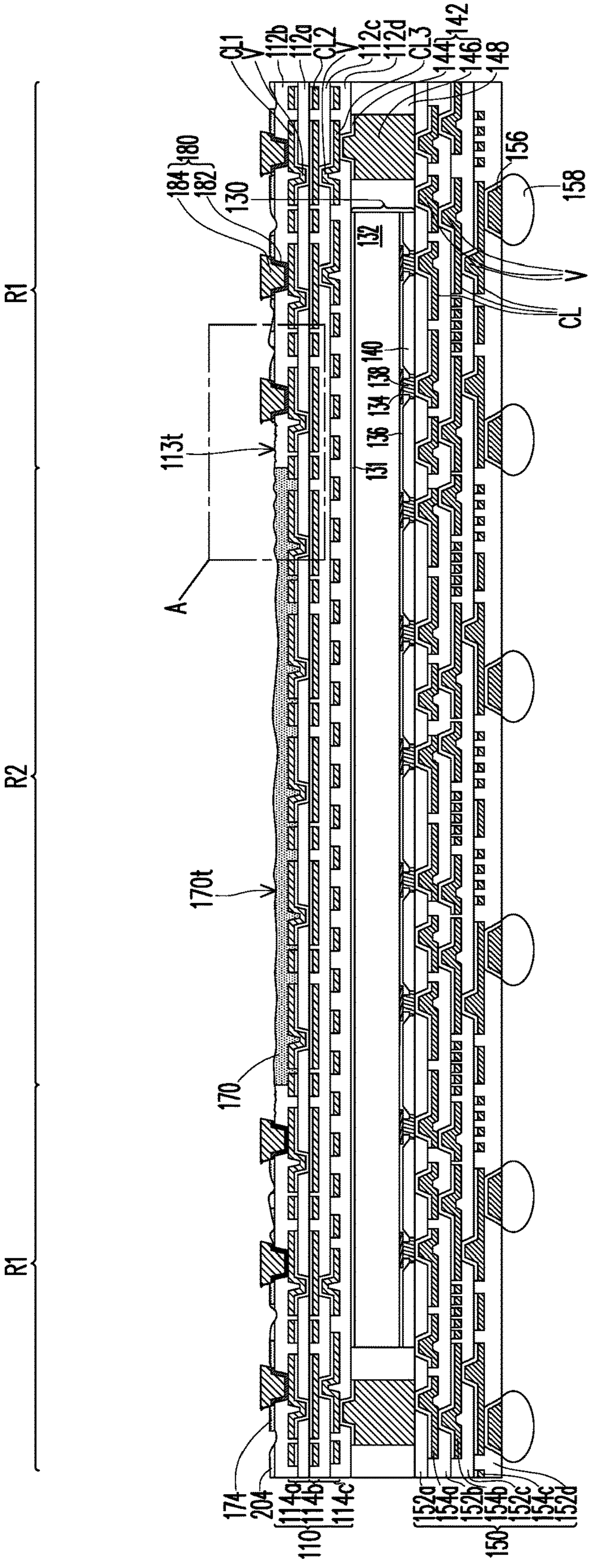

Referring to FIG. 5D and FIG. 6A, portions of the polymer layer 202 and the polymer layer 170 are removed, so as to expose sidewalls 180*s*1 of the UBM layer 180. In some embodiments, the polymer layer 202 and the polymer layer 170 are partially removed by a pulse laser drilling process, an etch process or other suitable process. In some embodiments, the polymer layer 202 and the polymer layer 170 are largely removed, and the top surface 113*t* of the polymer layer 112*b* may be partially exposed. In some embodiments, some residues (e.g., patterns) 174, 204 from the polymer layer 170 (i.e., the patterns 176) and the polymer layer 202 are remained on the polymer layer 112*b*. The exposed polymer layer 112*b* may be partially removed and thus the top surface 113*t* of the polymer layer 112*b* may be roughened and uneven. For example, the polymer layer 112*b* includes a plurality of protrusions 115 at the top surface 113*t*. As shown in FIG. 5D and FIG. 6A, after partially removal, the top surface 170*t* of the polymer layer 170 may be substantially coplanar with (e.g., slightly higher than) the top surface 113*t* of the polymer layer 112*b*, and are lower than the top surface 180*t* of the UBM layer 180. In other words, the UBM layer 180 substantially protrudes from the polymer layer 112*b* (and the polymer layers 170 and 202).

In some embodiments, exposed sidewalls 180*s*1 of the UBM layer 180 are also partially removed. Particularly, the exposed seed layer 182 may be removed, so that the sidewalls 184*s*1, 184*s*2 of the conductive layer 184 may be partially exposed. In some embodiments, the exposed seed layer 182 at a first side of the conductive layer 184 is substantially entirely removed, so that the sidewall 184*s*1 of the conductive layer 184 is substantially entirely exposed. On contrary, as shown in FIG. 5D, there may be some residues 183 of the seed layer 182 remained on the sidewall 184*s*2 of the conductive layer 184. However, the disclosure is not limited thereto. The seed layer 182 remained on opposite sidewalls 184*s*1, 184*s*2 of the conductive layer 184 may be similar. For example, both sidewalls 184*s*1, 184*s*2 of the conductive layer 184 have remained seed layers 182, or both sidewalls 184*s*1, 184*s*2 of the conductive layer 184 are entirely exposed. In some embodiments, after partial removal, the polymer layer 170 in the second region R2 is exposed, and there is substantially no polymer layer 202 and polymer layer 170 remained in the first region R1.

Figure 5E:
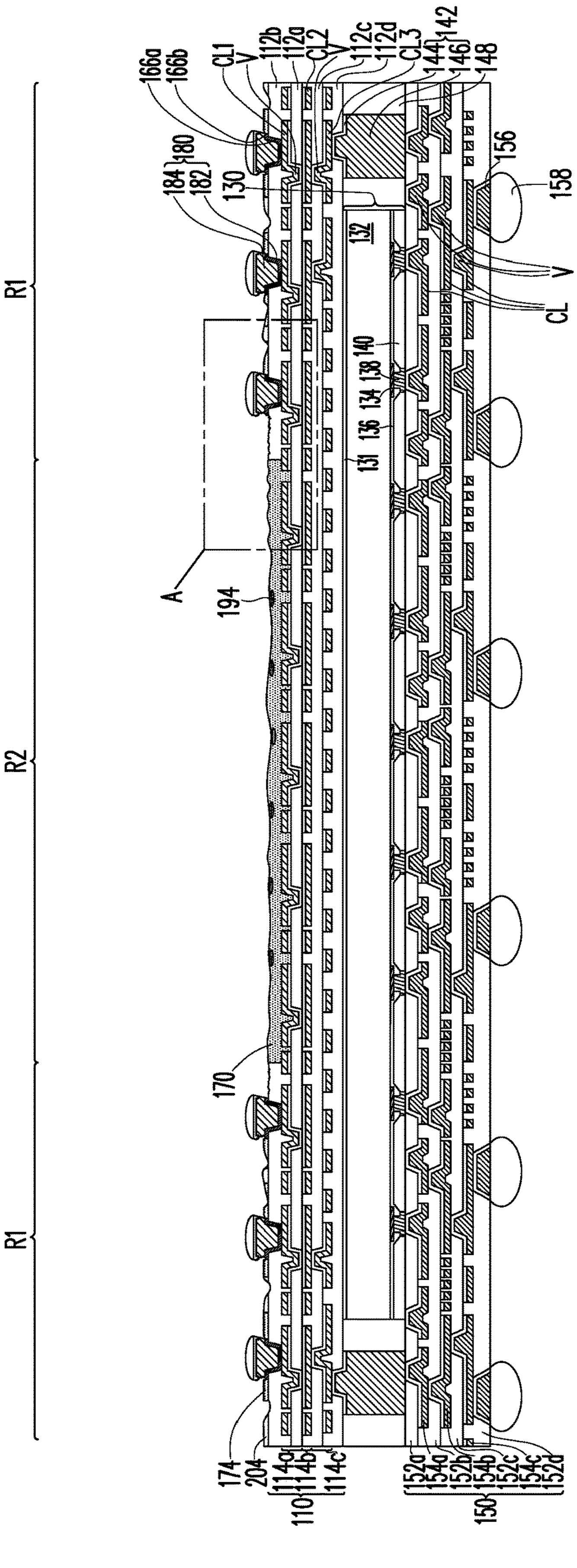

Referring to FIG. 5E and FIG. 6B, a solder layer 190 is formed on the UBM layer 180, and an IMC 192 may be formed between the solder layer 190 and the UBM layer 180. In some embodiments, since the UBM layer 180 substantially protrudes from the polymer layer 112*b* (and the polymer layers 170 and 202), there is no vertical interface between the sidewall 192*s* of the IMC 192 and the polymer layer 112*b*. Accordingly, the delamination due to the vertical interface between the IMC 192 and the polymer layer 112*b* is prevented. Then, a laser marking process is performed to form laser marks 194 in the polymer layer 170. The steps of formation of the solder layer 190 and the laser marking process are similar to those described before, and the description is not repeated herein. In some embodiments, the polymer layer 170 overlying the alignment mark AM is thin, and thus the alignment mark AM is clearer to see and the alignment process is easily performed.

Figure 7:
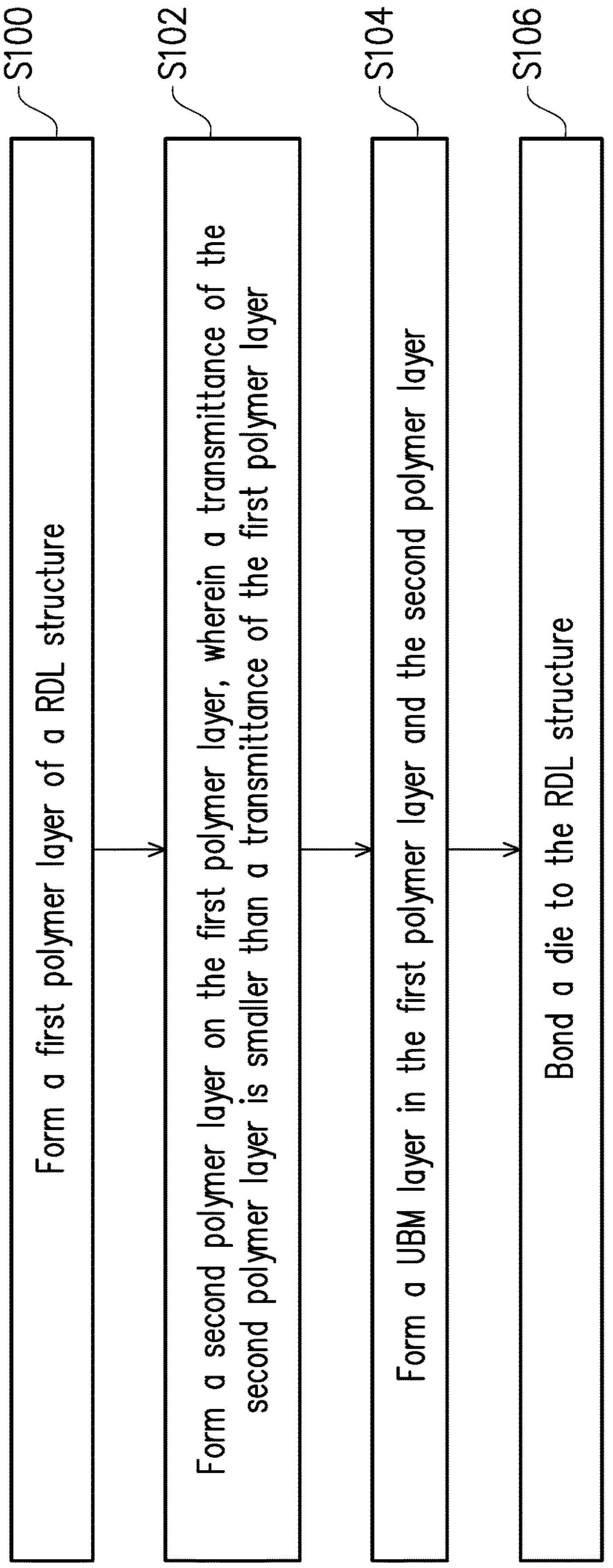
FIG. 7 illustrates a method of forming a semiconductor device in accordance with some embodiments of the present disclosure.

FIG. 7 illustrates a method of forming a semiconductor device in accordance with some embodiments of the present disclosure. Although the method is illustrated and/or described as a series of acts or events, it will be appreciated that the method is not limited to the illustrated ordering or acts. Thus, in some embodiments, the acts may be carried out in different orders than illustrated, and/or may be carried out concurrently. Further, in some embodiments, the illustrated acts or events may be subdivided into multiple acts or events, which may be carried out at separate times or concurrently with other acts or sub-acts. In some embodiments, some illustrated acts or events may be omitted, and other un-illustrated acts or events may be included.

At act S100, a first polymer layer of a RDL structure is formed. FIG. 1A, FIG. 1E, FIG. 4A and FIG. 5A illustrate views corresponding to some embodiments of act S100.

At act S102, a second polymer layer is formed on the first polymer layer, wherein a transmittance of the second polymer layer is smaller than a transmittance of the first polymer layer. FIG. 1B, FIG. 4A and FIG. 5A illustrate views corresponding to some embodiments of act S104.

At act S104, a UBM layer is formed in the first polymer layer and the second polymer layer. FIG. 1C, FIG. 4A and FIG. 5C illustrate views corresponding to some embodiments of act S106.

At act S106, a die is bonded to the RDL structure. FIG. 1E, FIG. 4A and FIG. 5A illustrate views corresponding to some embodiments of act S102.

In accordance with some embodiments of the disclosure, a semiconductor device includes a die, a redistribution layer (RDL) structure including a first polymer layer, a second polymer layer and a UBM layer. The die is encapsulated by an encapsulant. The RDL structure is disposed over the encapsulant. The second polymer layer is disposed on the first polymer layer, wherein a transmittance of the second polymer layer is smaller than a transmittance of the first polymer layer. The UBM layer is disposed over and electrically connected to the RDL structure, wherein the UBM layer is disposed in the first polymer layer and the second polymer layer.

In accordance with some embodiments of the disclosure, a semiconductor device includes a die, a RDL structure including a first polymer layer, a UBM layer, a second polymer layer and a laser mark. The die is encapsulated by an encapsulant. The RDL structure is disposed over the encapsulant. The UBM layer is electrically connected to the RDL structure and protruded from the first polymer layer. The second polymer layer is disposed over the RDL structure. The laser mark is disposed in the second polymer layer, and a top surface of the second polymer layer is substantially coplanar with a top surface of the first polymer layer.

In accordance with some embodiments of the disclosure, a method of forming a semiconductor device is as follows. A first polymer layer of a RDL structure is formed. A second polymer layer is formed on the first polymer layer over the die, wherein a transmittance of the second polymer layer is smaller than a transmittance of the first polymer layer. A UBM layer is formed in the first polymer layer and the second polymer layer.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:

a die, encapsulated by an encapsulant; and a redistribution layer (RDL) structure over the encapsulant, comprising a first polymer layer;

a second polymer layer on the first polymer layer, wherein a transmittance of the second polymer layer is smaller than a transmittance of the first polymer layer; and a UBM layer, disposed over and electrically connected to the RDL structure, wherein the UBM layer is disposed in the first polymer layer and the second polymer layer, and the first polymer layer is disposed between the die and the second polymer layer.

2. The semiconductor device of claim 1, wherein the transmittance of the second polymer layer is substantially equal to or larger than 50%, and the transmittance of the first polymer layer is substantially equal to or larger than 90%.

3. The semiconductor device of claim 1, wherein the first polymer layer and the second polymer layer comprise a same polymer.

4. The semiconductor device of claim 3, wherein the second polymer layer further comprise carbon black.

5. The semiconductor device of claim 1, wherein a top surface of the second polymer layer has a plurality of protrusions.

6. The semiconductor device of claim 1, wherein a top surface of the UBM layer is higher than a top surface of the second polymer layer.

7. The semiconductor device of claim 1, wherein the UBM layer has a first portion disposed in the first polymer layer and a second portion disposed in the second polymer layer and in direct contact with the first portion.

8. A semiconductor device, comprising:

a die, encapsulated by an encapsulant;

a RDL structure over the encapsulant, comprising a first polymer layer;

a UBM layer, electrically connected to the RDL structure and disposed in the first polymer layer, wherein a top surface of the UBM layer is higher than a top surface of the first polymer layer;

a second polymer layer over the RDL structure; and a laser mark in the second polymer layer, wherein a top surface of a portion of the second polymer layer is substantially coplanar with the top surface of the first polymer layer.

9. The semiconductor device of claim 8, wherein a transmittance of the second polymer layer is smaller than a transmittance of the first polymer layer.

10. The semiconductor device of claim 8, further comprising a plurality of dielectric protrusions at the top surface of the first polymer layer.

11. The semiconductor device of claim 10, wherein a material of the dielectric protrusions is the same as a material of the second polymer layer.

12. The semiconductor device of claim 10, wherein the dielectric protrusions are portions of the first polymer layer.

13. The semiconductor device of claim 8, wherein the second polymer layer is in direct contact with the first polymer layer.

14. A semiconductor device, comprising:

a RDL structure, comprising a first portion and a second portion;

a first polymer layer, covering the first portion of the RDL structure;

a second polymer layer, covering the second portion of the RDL structure, wherein a portion of the second polymer layer covers the first polymer layer, and a transmittance of the second polymer layer is smaller than a transmittance of the first polymer layer;

a UBM layer in the first polymer layer, wherein a top surface of the UBM layer is higher than a top surface of the first polymer layer; and a die, bonded to the RDL structure.

15. The semiconductor device of claim 14, wherein a top surface of the second polymer layer covering the second portion of the RDL structure is substantially coplanar with a top surface of the portion of the second polymer layer covering the first polymer layer.

16. The semiconductor device of claim 14, wherein a top surface of the second polymer layer covering the second portion of the RDL structure is substantially coplanar with the top surface of the first polymer layer.

17. The semiconductor device of claim 14, wherein the UBM layer comprises a seed and a conductive layer, and the conductive layer comprises a bottom portion in the first polymer layer and surrounded by the seed layer and a top portion exposed by the seed layer.

18. The semiconductor device of claim 17, further comprising a solder layer on the conductive layer and an IMC layer between the solder layer and the conductive layer, wherein the top portion is further exposed by the IMC layer and the solder layer.

19. The semiconductor device of claim 17, wherein a first sidewall of the top portion of the conductive layer is exposed by the seed layer, and a second sidewall opposite to the first sidewall of the top portion of the conductive layer is covered by the seed layer.

20. The semiconductor device of claim 14, wherein the portion of the second polymer layer comprises patterns exposing the first polymer layer, and the exposed first polymer layer has a rough surface.

* * * * *